United States Patent [19]
Fukuoka

[11] Patent Number: 5,949,654
[45] Date of Patent: *Sep. 7, 1999

[54] MULTI-CHIP MODULE, AN ELECTRONIC DEVICE, AND PRODUCTION METHOD THEREOF

[75] Inventor: Yoshitaka Fukuoka, Tokyo, Japan

[73] Assignee: Kabushiki Kaisha Toshiba, Japan

[ * ] Notice: This patent is subject to a terminal disclaimer.

[21] Appl. No.: 09/009,383

[22] Filed: Jan. 20, 1998

Related U.S. Application Data

[63] Continuation-in-part of application No. 08/674,807, Jul. 3, 1996, Pat. No. 5,818,699.

[51] Int. Cl.$^6$ .............................. H05K 01/18; H01L 25/00
[52] U.S. Cl. .......................... 361/760; 361/816; 361/818; 361/765; 361/783; 361/767; 361/807; 361/810; 257/723; 257/724; 257/700; 257/704; 257/774
[58] Field of Search ...................................... 361/760, 783, 361/777, 793, 767, 807, 810, 816, 818, 728, 736, 765, 744; 257/686, 668, 666, 685, 353, 724, 723, 786, 700, 704, 774; 439/69

[56] References Cited

U.S. PATENT DOCUMENTS

| | | |
|---|---|---|
| 5,153,709 | 10/1992 | Fukuoka ................................. 257/704 |
| 5,414,300 | 5/1995 | Tozawa et al. .......................... 257/704 |
| 5,473,512 | 12/1995 | Degani et al. ........................... 361/760 |
| 5,477,009 | 12/1995 | Brendecke et al. ..................... 174/52.3 |
| 5,639,989 | 6/1997 | Higgins, III .............................. 174/35 |
| 5,818,699 | 10/1998 | Fukuoka .................................. 361/760 |

*Primary Examiner*—Leo P. Picard
*Assistant Examiner*—David Foster
*Attorney, Agent, or Firm*—Finnegan, Henderson, Farabow Garrett & Dunner, L.L.P.

[57] ABSTRACT

A substantially lead-free mounting pad is formed on a first surface of a substrate having wiring circuits, and an electronic element having a substantially lead-free electrode is face-down mounted on the first surface. A substantially lead-free bump is formed on the substantially lead-free electrode of an electronic element. Mounting pads and substantially lead-free bumps are electrically and mechanically connected to each other by substantially lead-free conductive resin. A substantially lead-free sealing pattern is formed at the area which encloses the electronic element mounted area, of the first surface of the substrate. A weld ring made of Kovar is brazed onto the sealing pattern with substantially lead-free solder. The opening edge of a sealing cap made of Kovar disposed opposite to the weld ring and the weld ring are bonded at the deposited zone by welding.

20 Claims, 15 Drawing Sheets

MULTI-CHIP MODULE, AN ELECTRONIC DEVICE, AND PRODUCTION METHOD THEREOF

This is a continuation-in-part of application Ser. No. 08/674,807 filed Jul. 3, 1996, now U.S. Pat. No. 5,818,699.

BACKGROUND OF THE INVENTION

The present application claims priority of Japanese Patent Application No. Hei-7-169642 filed on Jul. 5, 1995 and Japanese Patent Application No. Hei-7-227987 filed on Sep. 5, 1995.

1. Field of the Invention

The present invention relates to a multi-chip module and production method thereof, and in particular relates to a multi-chip module and production method thereof, which do not adversely influence the environment in the processes from production to disposal thereof.

2. Description of the Related Art

A multi-chip module (including a hybrid IC) is such that a plurality of electronic elements, including an active element and a passive element, are mounted on a substrate having wiring circuits, and the mounting area is sealed. Since a plurality of electronic elements are made as modules, the multi-chip module has very high reliability. Furthermore, since it is possible to mount bare chips, the multi-chip module is suitable for a high density mounting of electronic elements.

In a conventional multi-chip module, electronic elements are mounted on, for example, a ceramic multi-layered substrate, using lead containing members such as solder and bumps, etc. Sealing members, for example, metal caps are sealed to a substrate by solder containing lead.

A conventional method for mounting passive electronic elements such as resistors, capacitors, etc. on a substrate which constitutes a multi-chip module, is the following, for example:

An eutectic solder paste, in which for example, the molar ratio of Sn:Pb is 63:37, is disposed on a die pad formed on a substrate by, for example, screen printing. Subsequently, electronic elements such as chip resistors, chip capacitors, etc. are loaded in face with electrodes thereof and the die pad. Thereafter, the solder is reflown by infrared rays, whereby the substrate and electronic elements are electrically and mechanically connected to each other. Metallic film consisting of for example, Ag/Pd (Ag—Pb alloy), Ag, etc. is formed at the electrodes of electronic elements such as, for example, chip resistors, chip capacitors, etc., and in order to enhance the wettability, for example, eutectic solder in which the molar ratio of Sn:Pb is 63:37 is plated on the metallic film.

After electronic elements are mounted, cleaning must be carried out with, for example, an organic solvent in order to remove the flux which was used to enhance the wettability of solder. This cleaning is a requisite process in order to secure the reliability of the multi-chip module.

A conventional method for mounting active elements such as semiconductor elements including CPUs, memory chips, etc. on a substrate which constitutes a multi-chip module, is the following, for example:

Firstly, a description will be given of a face-up mounting.

Back metallized layer is formed on the second face, which is the another surface of the first surface on which electrodes are formed, of a semiconductor.

A bonding agent such as, for example, an Au—Sn eutectic solder paste, eutectic solder paste in which the molar ratio of Sn:Pb is 63:37, or eutectic solder paste in which the molar ratio of In:Pb is 50:50 is disposed on a die pad formed on a substrate by, for example, a screen printing. Subsequently, electronic elements such as semiconductor elements are mounted in such a manner that the second face thereof is opposite to the die pad. Thereafter, the solder is reflown by infrared rays or the like, whereby the substrate and semiconductor elements are electrically and mechanically connected to each other. In a case where an Sn—Pb eutectic solder is used, it is necessary to form barrier metal on the die pad and at the metallized layer of the second face of semiconductor elements in order to prevent the diffusion of Sn—Pb eutectic solder.

In this case, after electronic elements such as semiconductor elements are mounted, cleaning must be carried out with an organic solvent or the like in order to remove the flux which was used to enhance the wettability of solder.

After the flux constituents are removed, electric connection is achieved between the substrate and semiconductor elements by bonding the electrodes which are inner lead bonding pads (I.L.B. pads) of the first face of the semiconductor elements to the bonding pads (the outer lead bonding pads : O.L.B. pads) formed at the substrate by means of remarkably fine bonding wires made of Au, Cu, Al, or the like.

On the other hand, the following is a method for a flip chip bonding (race down bonding) of electronic elements such as semiconductor elements on a substrate.

Barrier metal is formed at the electrodes that are inner lead bonding pads of Al or the like formed at the first face of the semiconductor elements to be mounted by, for example, vapor deposition or sputtering. And, solder bump in which the molar ratio of Sn:Pb is 10:90 is formed on -he barrier metal by vapor deposition, plating, bonding or the like. The first face of semiconductor elements at which solder bumps are thus formed is face down bonded to the connecting location of a substrate with the eutectic solder paste in which the molar ratio of Sn:Pb is 63:37 by the infrared reflow process, whereby the die pads and solder bumps are electrically and mechanically connected to each other.

Also in this case, after electronic elements such as semiconductor elements are mounted, cleaning must be carried out with, for example, an organic solvent in order to eliminate the flux which was used to enhance the wettability of solder.

Thus, in any cases, where active elements such as semiconductor are mounted by face up bonding, or mounted by face down bonding, it is essential to eliminate flux constituents.

The following is a method for a sealing the substrate on which electronic components are already mounted.

A sealing pattern is formed in advance in the circumjacent of an area of a substrate where electronic elements are mounted. The sealing pattern may be formed simultaneously with die pads, O.L.B. (outer lead bonding) pads or the like at which electronic elements are mounted.

For example, an Sn—Pb based solder is loaded on the sealing pattern and a metal cap is disposed with the opening edge coincident, whereby the sealing pattern and metal cap are soldered. As for solder, eutectic solder containing a large amount of lead, such as Sn:Pb is 63:37, is employed in order to enhance the reliability of the connection between the metal cap and sealing pattern.

In a case where a substrate made of inorganic materials such as alumina ceramic is utilized, the metal cap is made of Fe—Ni—Co based alloy and Fe—Ni based alloy such as Fernico, Kovar or the like, the thermal expansion coefficient of which is nearly equal to that of the substrate. A solder coating film is formed on the surface of such a metal cap in order to improve the solder wettability.

Also after the metal cap is soldered, cleaning must be carried out with, for example, organic solvent, in order to eliminate the flux constituents.

FIG. 14 is a view showing a brief structure of a conventional multi-chip module 900a.

For example, an inorganic substance based multi-layered substrate 901 such as ceramic has a wiring pattern having a mounting pad (outer lead bonding pad : O.L.B. pad) 903 made of tungsten(W) having a thin Ni/Au plating layer, for example, which is formed at the connecting location in the first area of the first face where electronic elements are mounted. The mounting pads (O.L.B. pads) 903 of the multi-layered substrate 901 are electrically and mechanically connected to the Al electrodes (I.L.B. pads) 904 of semiconductor elements 902 with solder 905 having lead and solder bumps 905 containing lead.

A sealing pattern 907 is formed in advance at the multi-layered substrate 901 in such a manner that the first area is enclosed in which electronic elements including semiconductor elements 902 are face-down bonded. The sealing pattern 907 and the opening edge portion 908a of the metal cap 908 are sealed with solder 910.

The multi-layered substrate 901 has a plurality of insulating layers 901a made of, for example, alumina ceramic and a wiring pattern 901b. The wiring pattern 901b is disposed between the insulating layers 901a. Furthermore, multi-layered substrate 901 is provided with a connection means with peripheral circuits such as input/output pads 909 and input/output leads (not illustrated).

The connection between the Al electrodes (I.L.B. pads) 904 of semiconductor elements 902 and the mounting pads (O.L.B. pads) 903 of the multi-chip substrate 901 are established with solder (Sn:Pb=63:37) 905 which connects solder bumps (Sn:Pb=10:90) 906 secured at the Al electrode 904 face and mounting pads (O.L.B. Pads) 903.

The opening edge 908a of the metal cap 908 consisting of Kovar or Fe/Ni 42 alloy and sealing pattern 907 are sealed with solder (Sn:Pb=63:37) 910.

Eutectic solder, the Pb constituent ratio of which is high, is used to promote the solder wettability, and in order to secure the reliability of the multi-chip module 900a. After semiconductor elements 902 are mounted with solder 905 and the metal cap 908 is sealed with solder 910, the multi-chip module must be cleaned with an organic solvent in order not to remove any residue of the flux constituents of the solder.

FIG. 15 is a view showing a brief structure of a conventional multi-chip module 900b.

For example, as for an inorganic material based multi-layered substrate 901 such as a ceramic multi-layered substrate, a wiring pattern having a mounting pad 903 at the connecting location of electronic elements. The mounting pad 903 is formed at the first area of the first face where electronic elements are mounted at the first area of the first face on which electronic elements are mounted. A semiconductor element 902 as a active element and a chip capacitor 921 as a passive element are mounted at the multi-layered substrate 901 via conductor pads 903.

The mounting pads 903 of the multi-layered substrate 901 are mechanically connected to the second face of semiconductor elements 902 with solder (for example, In:Pb=50:50 or Sn:Pb=63:37). The second surface, the other side surface on which electrodes are formed, of the semiconductor element 902 is metallized in advance with Al, etc.

Similarly, the mounting pads 903 are electrically and mechanically connected to the chip capacitor 921 with solder 905. The electrode of the chip capacitor 921 is coated with Ag/Pd, and furthermore solder coating films 923 (for example, Sn:Pb=63:37) are formed.

The Al electrodes 904 of the first face of the semiconductor elements 902 are electrically connected to the mounting pads 903 of the multi-layered substrate 901 by bonding wires 922 (for example, fine wires made of Au or Al).

The first area where the semiconductor elements 902 as an active elements, passive element 921, etc. are mounted is thus covered, whereby a sealing pattern 907 is formed on the multi-layered substrate 901 surface. The opening edge portion 908a of the sealing pattern 907 and metal cap 908 is sealed with solder 910 (for example, Sn:Pb=63:37).

The metal cap 908 is made of, for example, kovar or Fe/Ni 42 alloy with thin solder coating films (Sn:Pb is 63:37, for example).

The construction of the multi-layered substrate 901 is similar to that of a multi-chip module shown in FIG. 14.

As a multi-layered substrate 901, the mounting area can be covered with a thin flexible film made of resin having wiring circuits. For example, a ceramic multi-layered substrate having a thin film made of a polyimide as a insulating layer and a wiring layer made of Cu on the surface reduces capacitance of the wiring pattern, and improves the signal transfer characteristics.

In the multi-chip module 900b, eutectic solder having a high Pb constituent ratio is employed to promote solder wettability, and in order to secure the reliability of multi-chip modules 900b. After semiconductor elements 902, chip capacitors 921, etc., are mounted with solder and a metal cap 908 is sealed with solder 910, they are cleaned with an organic solvent to remove any residue of the flux constituents of solder.

Thus, in conventional multi-chip modules, connecting materials containing lead are used to mount electronic elements and to connect the metal cap.

Therefore, in order to secure the reliability of multi-chip modules, a process for eliminating flux constituents is requisite. For cleaning flux constituents, for example, halogenized hydrocarbon such as freon, chlorofluorocarbon, trichloroethane, etc. were conventionally used. However, in order to prevent the ozone layer from being destroyed and to preserve the earth environment, the use of such chlorofluorocarbon has been regulated all over the world. Cleaning agents which are not regulated may be used. However, such cleaning agents are not sufficient to remove flux constituents, and it is difficult to establish an enough reliability of the multi-chip module.

Furthermore, not only does the flux cleaning process itself incur a cost, but also the cost of cleaning agents which are not regulated is high, and it causes the production cost of the multi-chip module expensive.

In other words, as described above, conventional multi-chip modules use bonding materials containing lead when mounting electronic elements and connecting sealing members.

Lead is highly toxic, and the use thereof has recently become a serious social problem.

Since lead has a high toxicity and the assimilation thereof into the human body impairs the nervous system and/or fecundity, the handling of lead and substances containing the same is regulated. Accordingly, it is necessary to handle lead safely when producing multi-chip modules. Therefore, the facilities and labor cost therefor are required, thereby causing the production cost of multi-chip modules to be made expensive.

Still furthermore, the concern for environmental destruction has been recently risen, and disposal of waste electronic devices and components in which solder alloys containing lead was used has become a social problem.

That is, it was general for the waste of disposed electronic devices including solder alloys containing lead to be disposed by being buried in soil together with industrial and general waste.

However, in a case where complex waste containing harmful substances such as lead contained in waste electronic devices are buried for disposal, the lead constituent may dissolve and come out due to precipitation or the like, whereby the soil and underground water may be contaminated and the environment is seriously influenced. This is also a serious problem. Especially, the dissolution quantity of lead from solder alloy due to acid rain radically increased, and there is a worry that the environment and nature will be seriously influenced. The waste containing lead is treated and disposed in a controlled treating facility, the cost of which is very expensive. Since it is difficult to remove solder containing lead, recycling is difficult, too.

Therefore, it takes much cost for disposing conventional multi-chip modules. In other words, since conventional multi-chip modules contain harmful lead and are dangerous, much cost is required in every step of the life cycle of conventional multi-chip modules from the production thereof to adequate treatment thereof as waste.

In either case, the construction and production of conventional multi-chip modules in which lead is used must be replaced. Of course, although such an effort has been made, a cost-suppressed and practical means has not yet been established.

SUMMARY OF THE INVENTION

The invention was developed to solve these and other drawbacks and shortcomings described above.

It is therefore an object of the invention to provide a substantially lead-free multi-chip module and production method thereof in which substantially no lead is used for mounting electronic elements and no lead is used for connecting a sealing cap.

It is another object of the invention to provide a production method of multi-chip modules, which is safe and has a high productivity.

It is a still another object of the invention to provide a multi-chip module and production method thereof, in which no cleaning process of flux is required and the productivity of which is very high.

It is a further object of the invention to provide a multi-chip module and production method thereof, by which the production multi-chip modules are able to be produced without generating lead vapor.

It is a still further object of the invention to provide a multi-chip module and production thereof, which does not contaminate the environment owing to lead even after the disposal thereof.

In the present invention, a multi-chip module refers to one where active elements such as semiconductor elements and passive elements such as chip capacitors and chip resistors are mounted on a substrate in a high density and the area on which these electronic elements are mounted is hermetically sealed by a sealing cap or the like.

In the invention, as an electronic elements to be mounted, there is an active element, a passive element or a combination of active and passive elements, for example. The active elements are mounted with a face-up type, face-down type or bare-chip mounting.

As a substrate there is a multi-layered substrate or a single-layered substrate, for example. Furthermore, the same may be a substrate made of inorganic material such as a ceramic substrate or may be a substrate made of resin (ex. prepreg) material. Still furthermore, the same may be a complex substrate of a combination thereof. The substrate made of resin material may include a flexible substrate, film carrier or the like. For example, a thin film circuit like a flexible substrate consisting of a conductor layer made of Cu foil or the like and an insulating layer made of a resin material may be formed, as a complex substrate, at the electronic component loaded area of a ceramic substrate. The thin film circuit may be formed of an insulating layer which is a material such as, for example, polyimide, BCB (benzocyclobutane), teflon, etc., whose dielectric constant is relatively small, and a conductive layer, for example, Cu, which is formed by a thin film deposition system. And if electronic elements are mounted on the thin film circuit formed at the first area of the ceramic substrate, the wiring capacity is decreased, and it is possible to provide a construction which is suitable for a multi-chip module which ensures high response.

Still furthermore, a multi-chip module includes an MCM-L using a resin made substrate, an MCM-C using a ceramic substrate, an Si substrate having the wiring carried out by a thin film deposition system, and an MCM-Dusing an Al substrate. Furthermore, hybrid ICs, PCMCIA cards, or the like are included in multi-chip modules according to the invention.

In order to achieve these and other objects, a multi-chip module according to the invention is such that electronic elements are mounted on a substrate having wiring circuits by a substantially lead-free bonding means, and a substantially lead-free sealing cap which seals the area of the substrate, at which electronic elements are mounted, is connected by a substantially lead-free sealing means.

Employing those structures and manufacturing methods described below, a substantially lead-free multi-chip module which. has a high reliability and a high productivity is obtained in the invention.

One of the major purpose of the invention is to provide a substantially lead-free multi-chip module and production method thereof in which substantially no lead is used for mounting electronic elements and substantially no lead is used for connecting a sealing cap, and does not contaminate the environment owing to lead even after the disposal thereof.

From those view points, "a substantially lead-free" includes a case which contain a trace or a small amount of lead, which is in the range capable of preventing negative influences to a human body or natural environment, in materials or parts consists the multi-chip module though completely lead-free is most preferable. For example, an amount of about 1 wt % or less, more preferably an amount of about 0.5 wt % is allowed to be contained in a substantially lead-free means (ex. a mounting means connecting a semiconductor chip and a wiring substrate for example) in the invention. In addition, containing a trace amount of lead due to a inescapable contamination is also allowed in a multi-chip module in the invention. However, it is required to control a contained lead amount so that [Pb] is not more than 5.0 mg/l when TCLP (Toxicity Characteristic Leaching Procedure, Method 1311 for example) is done to prevent a negative influence to the environment.

A first aspect of the invention is a multi-chip module comprising, a substrate having a first wiring circuit, a first area formed on a first surface and a second area formed on the first surface which encloses the first area, the substrate having a mounting pad (O.L.B. pad) formed on the first area, and the substrate having a sealing pattern formed on the second area, an electronic element having a first surface in face with the first area of the substrate, the electronic element having an electrode (inner lead bonding pad : I.L.B. pad) formed on the first surface, a substantially lead-free mounting means for mounting the electronic element onto the first area of the substrate, a substantially lead-free metal cap having an opening end, and a substantially lead-free sealing means for sealing the sealing pattern of the substrate and the opening end of the metal cap. The invention is not only adopted for a multi-chip module but also adopted for a semiconductor package a single chip is mounted. That is a electronic device comprising, a substrate having a first wiring circuit, a first area formed on a first surface and a second area formed on the first surface which encloses the first area, the substrate having a mounting pad (O.L.B. pad) formed on the first area, and the substrate having a sealing pattern formed on the second area, an electronic element such as a semiconductor chip for example, having a first surface in face with the first area of the substrate, the electronic element having an electrode (inner lead bonding pad I.L.B. pad) formed on the first surface, a substantially lead-free mounting means for mounting the electronic element onto the first area of the substrate, a substantially lead-free metal cap having an opening end, and a substantially lead-free sealing means for sealing the sealing pattern of the substrate and the opening end of the metal cap.

The second aspect of the invention is a multi-chip module comprising, a substrate having a first wiring circuit, a first area formed on a first surface and a second area formed on the first surface which encloses the first area, the substrate having a mounting pad (die bonding pad or die pad) and a bonding pad (O.L.B. pad) formed on the first area, and the substrate having a sealing pattern formed on the second area, a first electronic element having a first surface, the electronic element having a second surface in face with the first area of the substrate, the electric element having an electrode (I.L.B. pad) formed on the first surface an approximately lead-free mounting means for mounting the first electronic element onto the first area of the substrate, a substantially lead-free metal cap having an opening end, and an approximately lead-free sealing means for sealing the sealing pattern of the substrate and the opening end of the metal cap.

The third aspect of the invention is a multi-chip module comprising, a substrate having a first wiring circuit, a first area formed on a first surface and a second area formed on the first surface which encloses the first area, the substrate having a first mounting pad and a second mounting pad formed on the first area, the substrate having a bonding pad formed on the first area, and the substrate having a sealing pattern formed on the second area, an active element having a first surface, a second surface in face with the first area of the substrate, and the active element having an electrode (I.L.B. pad) formed on the first surface, a passive element having an electrode, the passive element only having a substantially lead-free metal layer deposited on the electrode, an approximately lead-free mounting means for mounting the active element and the passive element onto the first area of the substrate, a substantially lead-free metal cap having an opening end, and a substantially lead-free sealing means for sealing the sealing pattern of the substrate and the opening end of the metal cap.

The fourth aspect of the invention is a multi-chip module comprising, a substrate having a first wiring circuit, a first area formed on a first surface and a second area formed on the first surface which encloses the first area, electronic elements, a substantially lead-free mounting means for mounting the electronic elements onto the first area of the substrate, a substantially lead-free metal cap having an opening end and a substantially lead-free sealing means for sealing the second area of the substrate and the opening end of the metal cap.

The first area can be covered with a film made of resin, the film having a second wiring circuit connected with the first wiring circuit, and the film having the mounting pad and the bonding pad including die bonding pads and O.L.B. pads the opposite surface of the substrate formed thereon.

A mounting means consists of a substantially lead-free bump formed at the electrode (I.L.B. pads) of the electric element and substantially lead-free conductive resin or substantially lead-free conductive paste which electrically and mechanically connecting the mounting pad (O.L.B. pads) and the bump, for example. Further, a mounting means consists of a substantially lead-free metal film deposited on the electrode and substantially lead-free conductive resin or paste electrically and mechanically connecting the mounting pad (die pad) and the electrode having the metal film, for example.

A mounting means in the invention consists of substantially lead-free conductive resin or paste mechanically connects the mounting pad (die pad) and the second surface of the first electronic elements and a substantially lead-free bonding wire electrically connecting the bonding pad (O.L.B. pads) of the substrate and the electrode (I.L.B. pad) of the first electronic element, for example.

A mounting means in the invention consists of substantially lead-free conductive resin electrically and mechanically connecting the mounting pad (die pads) and the second surface of the first electronic element, and a substantially lead-free bonding wire electrically connecting the bonding pad (O.L.B. pads) of the substrate and the electrode (I.L.B. pads) of the first electronic element. When the second surface of the electronic element is metallized, a potential or the second surface or the electronic element can be controlled through the mounting pad (die bonding pads).

A mounting means, in the invention consists of a first connecting means and a second connecting means in combination, the first connecting means having a substantially lead-free conductive resin such as a substantially lead-free conductive paste which connects the first mounting pad (die bonding pads) and the second surface of the active element, the first connecting means having the substantially lead-free conducting resin which connects the second mounting pad (die pad) and the electrode of the passive element having the deposited metal layer, and the second connecting means having a substantially lead-free bonding wire which connects the bonding pad (O.L.B. pads) and the electrode (I.L.B. pads) of the active element, for example.

A mounting pad, a bonding pad including die pad and O.L.B. pad and a sealing pattern in the invention are made of a substantially lead-free metal, for example, these pads and pattern are made of at least one element selected from a group of consisting of W, Ni, Au, Ag, Cu, Pd, Mo, Pt, Ni/Au, Ag/Pd, for example.

Also, A bump is made of a substantially lead-free metal in the invention. The bump is made of at least one element selected from a group of consisting of Au, Ag, Cu, Pd, Ni, Cr, Ti, for example.

A conductive resin is also made of a substantially lead-free materials in the invention and consists of at least one element selected from a group of consisting of Ag, Cu, Au, Pd, Pt as a conductive particles. An anisotropic conductive film is also used as the conductive resin in the invention.

A bonding wire used in the invention is made of at least one element selected from a group of consisting of Au, Al, Cu for example.

A metal film formed on electrodes of an electric element in the invention is made of at least one element selected from a group consisting of Au, Ag, Pd, Ag/Pd (alloy made of Ag and Pd), for example.

A substantially lead-free sealing means, in the invention, consists of a weld ring brazed onto the sealing pattern with a substantially lead-free solder, and a deposited zone which connects the weld ring and the metal cap, for example. A weld ring, a metal cap and a deposited zone are made of Fe—Ni—Co alloy, Fe—Ni alloy, for example and the thermal expansion coefficients of them are almost the same with that of substrate made of ceramics The fifth aspect of the invention is a method for producing multi-chip module comprising the steps of, (a) forming a substantially lead-free bump on an electrode (I.L.B. pad) of a first surface of a first electronic element, (b) forming a substrate having a first wiring circuit, a first area on a firs surface, a second area which surrounds the first area, a first mounting pad (including die pad and O.L.B. pad) connected to the wiring circuit on the first area, a sealing pattern at the second area, (c) brazing a substantially lead-free weld ring on the sealing pattern, (d) forming a substantially lead-free conductive resin layer on the first mounting pad (die pad and O.L.B. pad), (e) disposing the first surface of the first electronic element in face with the first area of the substrate so that the substantially lead-free conductive resin layer is intervened between the first mounting pad (O.L.B. pad) and the bump, (f) curing the substantially lead-free conductive resin so that the first electronic element and the substrate are fixed, and the first mounting pad (O.L.B. pad) and the bump are electrically connected, (g) disposing an opening edge of a metal cap in face with the weld ring, and (h) welding the opening edge of the metal cap and the weld ring. According to this method it is also available to produce a module with, in step (b), forming a substrate further having a second mounting pad connected to the first wiring circuit on the first area of the substrate, in step (d), forming a substantially lead-free conductive resin layer is formed on the first mounting pad and second mounting pad, in step (e), disposing the first area of the substrate and the first surface of the first electronic element so that the conductive resin layer intervened between the first mounting pad and the bump, and disposing the first area of the first substrate and the second electronic elements so that the conductive resin layer intervened between the second mounting pad and an electrode of the second electronic element, and in step (f), curing the substantially lead-free conductive resin so that the first electronic element and the substrate are fixed, the second electronic element and the substrate are fixed, the first mounting pad and the bump are electrically connected, and the second mounting pad and the electrode of the second electronic element are electrically connected.

The sixth aspect of this invention is a method for producing multi-chip modules comprising the steps of, (a) forming a substrate having a first wiring circuit, a first area on a first surface, a second area surrounds the first area, a first mounting pad (die pad) on the first area, a bonding pad (O.L.B. pad) connected to a first wiring circuit on the first area, and a sealing pattern at the second area, (b) brazing a substantially lead-free weld ring on the sealing pattern, (c) forming a substantially lead-free conductive resin layer on the first mounting pad (die pad), (d) disposing a second surface of a first electronic element, the first electronic element having an electrode (I.L.B. pads) on its first face, in face with the first area of the substrate so that the substantially lead-free conductive resin layer is intervened between the first mounting pad (die pad) and second surface of the first electronic element, (e) curing the substantially lead-free conductive resin so that the first electronic element and the substrate are fixed, (f) bonding the bonding pad (O.L.B. pad) and the electrode (I.L.B. pad) of the first electronic element with a substantially lead-free bonding wire, (g) disposing an opening edge of a substantially lead-free metal cap in face with the weld ring and (h) welding the opening edge of the metal cap and the weld ring. According to this method it is also available to produce a module with, in step (a), forming a substrate further having a second mounting pad connected to the first wiring circuit on the first area of the substrate, in step (c), forming a substantially lead-free conductive resin layer is formed on the first mounting pad and second mounting pad, in step (d), disposing the first area of the substrate and the second surface of the first electronic element so that the conductive resin layer intervened between the first mounting pad and second surface, and disposing the first area of the first substrate and a second electronic elements so that the conductive resin layer intervened between the second mounting pad and an electrode of the second electronic element and in step (e), curing the substantially lead-free conductive resin so that the first electronic element and the substrate are fixed, the second electronic element and the substrate are fixed, and the second mounting pad and the electrode of the second electronic element are electrically connected.

In the invention laser welding or seam welding is employed to seal the opening edge of the metal cap and the weld ring.

As described, a multi-chip module according to the invention is such that electronic elements are mounted by an approximately lead-free mounting means and a sealing cap is enclosed by a substantially lead-free sealing means. In the invention, "substantially lead-free" is that something that does not include any lead essentially, though it could be used something that include trace amount of lead.

When mounting electronic elements such as semiconductor electronic elements, in a case of a face-down mounting like a flip chip bonding of bare chips, substantially lead-free mounting pads (O.L.B. pads) formed on a substrate and substantially lead-free bumps formed at the electrodes (I.L.B. pads) of electronic elements are electrically and mechanically connected to each other by a substantially lead-free conductive resin (including a conductive adhesive) or an anisotropic conducting film, etc. Substantially lead-free bumps formed at the I.L.B. pads which formed on a first surface of an electronic element. Substantially lead-free bumps are made of a material such as Au, Ag, Cu or Ni, by a wire bonding method or a transfer method or a plating method for example. Furthermore, a conductive layer of Au, Ag, Cu or Ni, etc. may be provided at the spherical surface of resin having elasticity by coating or plating, for example.

As for the mounting pads, W, Cu, Al, Ni, Au, Ag, Pd, Pt or the like may be used for the electrode of electronic component.

The conductive resin is such that conductive particles made of conductive materials, which is also substantially lead-free in the invention, are dispersed on a binder such as, for example, epoxy based resin. A conductive particle is made of Ag, Pd, Pt, Au, for example. Furthermore, substantially lead-free glass frit having a relatively low melting point may be used for the binder.

The anisotropic conducting film (ACF) is such that conductive particles are dispersed in a resin film. The film is placed between the terminals to be connected and the same is heated and press fitted, whereby the conductive particless which exist between the terminals are crushed to allow the filers to be brought into racial contact with each other, thereby causing conductivity to be secured therebetween.

In a case of a face-up type mounting, substantially lead-free mounting pads (die pads and O.L.B. pads) formed on a substrate and the second face of electronic element are connected to each other by a substantially lead-free conductive resin (including a conductive adhesive), an anisotropic conducting film or the like. In a case where an electronic element has a metallized layer at the second face, it is possible to control the second face at a reference potential or ground potential through the substantially lead-free conductive resin and anisotropic conducting film. In a case where it is not necessary to control the second face of the electronic element at a reference potential, a substantially lead-free mounting pad and the second face of the electronic element are bonded to the substrate by an insulating adhesive.

The electrodes (I.L.B. pads) formed on the first face of the electronic element and bonding pads (O.L.B. pads) formed on the substrate are electrically connected to each other by substantially lead-free bonding wires made of Au, Al or the like. When connecting I.L.B. pads of the electronic elements with bonding wires, ultrasonic waves may be used to connect the electrodes made of, for example, Al with the bonding wires made of Al. When connecting electrodes made of for example, Al with bonding wires made of Au, their connection is carried out by ultrasonic and thermal compression method.

Mounting of passive elements such as chip capacitors and chip resistors carried out in a manner similar to that of the face-down type mounting described above, for example. However, the mounting by a wire bonding is not excluded.

A coated film made of Ag, Pd or their alloys Ab/Pd is exposed at the electrodes of passive elements such as chip capacitors or chip resistors. In the present invention, since essentially no solder having lead is used for mounting electronic elements, it is not necessary to provide a solder coating by for example, Pb—Sn based solder, at the mounting portions of the passive elements.

Next, a description will be given of the bonding between a substrate and sealing cap.

In the invention, a sealing cap and a substrate are sealed by a substantially lead-free sealing means. No solder containing lead is used in the bonding of the sealing cap.

Firstly, a sealing pattern is formed on a substrate. The sealing pattern formed, for example, simultaneously with a mounting pad which includes die pad and O.L.B. pad on which electronic elements are mounted. Furthermore, the same may be formed simultaneously with the wiring circuits of a substrate. A substantially lead-free weld ring made of Fe—Ni based alloy or Fe—Ni—Co based alloy is bonded on this sealing pattern by substantially lead-free solder such as silver copper eutectic alloy, silver solder, gold solder or the like. The weld ring refers to not only annular rings but also rectangular rings.

A substantially lead-free sealing cap made of Fe—Ni based alloy or Fe—Ni—Co based alloy is disposed on a weld ring and is bonded by laser welding, seam welding, etc. Therefore, the sealing cap and weld ring are bonded to each other by a deposited zone formed on the openig end of the metal cap.

In multi-chip modules according to the invention, it is important that the thermal expansion coefficient of a sealing cap, a substrate, and a weld ring are almost equal to each other. As a weld ring and a metak cap in the invention, substantially lead-free Fe—Ni—Co based alloy or substantially lead-free Fe—Ni based alloy such as Fernico, Kovar, or the like is used, for example. Since the thermal expansion coefficient of these alloys is almost equal to that of ceramic based substrates, no warping of substrate nor defective bonding occurs. Therefore, the reliability of the multi-chip module is promoted.

As described above, in the invention, a substantially lead-free mounting pad including die pad and O.L.B. pad which ensures an electrical connection with a substantially lead-free electrode of semiconductor element is formed on the first face of a multi-layered wiring substrate made of inorganic material such as ceramics. A substantially lead-free conductive resin, a substantially lead-free ACF or a substantially lead-free conductive paste layer, the main component of which is for example, Ag or the like, is formed on this mounting pads which are usually formed by tungsten (W) on which thin Ni (Au) plating layer exists, and a substantially lead-free bump of Au is formed at the electrode made of Al or the like of the semiconductor element. Subsequently, positioning with the mounting pads on the substrate is carried out, and the bump of Au or the like is buried in a substantially lead-free conductive paste of Ag or the like. Hereby, the corresponding conductive resin is heated and cured. Thus, a semiconductor element is supported and fixed on a substrate, whereby a flip chip bonding to form an electrical connection is carried out.

Furthermore, a metal cap is placed onto a weld ring which is formed at the second area surrounding the first area, where electronic elements are mounted, by a substantially lead-free solder material such as silver copper eutectic alloy or the like in advance. so as to seal the mounting area of a substrate in a hermetic state, and a laser beam is irradiated onto the outer rim part of the metal cap and the surface of the metal weld ring brought into contact therewith, thereby causing hermetic sealing to be secured by welding. Therefore, a multi-chip module and production method thereof according to the invention is characterized in that it is unnecessary to use lead contained in solder etc., which is harmful to the human body, and no cleaning process of electronic elements, which will be a source of the environmental contamination of the earth, is required.

Still furthermore, the weld ring and the metal cap are positioned so that the weld ring adhered to and formed at the second area of the substrate, which encloses the first area where electronic elements are mounted, by a substantially lead-free solder material such as silver copper eutectic alloy or the like, a substantially lead-free adhesive etc. It is made coincident with the outer rim of the metal cap, and a seam welding method or a laser welding method is employed for sealing hermetic.

Therefore, a multi-chip module and production method thereof according to the invention is featured in that no harmful lead, contained in solder, etc., which is harmful to the human body is used and no cleaning process of electronic elements, which constitutes one of the causes of the environmental contamination of the earth, is required.

Still furthermore, substrate made of inorganic materials such as ceramic is formed by a co-fired or as-fired green sheet process, for example. Still furthermore, if a substrate is adhered and formed by the weld ring, for example, substantially lead-free hard solder such as silver copper eutectic alloy or Ag solder, etc., it is not necessary to use lead, contained in solder, which is harmful to the human body, and no cleaning process of electronic elements, which is one of the causes of the environmental contamination of the earth, is required.

According to the invention, the surface of the substrate including a mounting pad is covered by a thin film made of resin having a wiring circuit and a mounting pad. For example, a conductive layer such as Cu film or the like is produced by deposition or sputtering, etc., and may be formed by a thin film wiring process which is able to form patterns by a photo etching process. Foe example, insulating layer such as polyimide, BCB, teflon or the like are produced by photo-etching process.

By forming substantially lead-free thin film having circuits, it is suitable for fine-pitched connections, high density mounting and highspeed response of elements. Moreover, it is not necessary to use lead contained in solder, which is harmful to the human body and the environment, and no cleaning process of modules, which is one of the causes of the environmental contamination of the earth, is required.

According to the invention, bumps of Au or the like formed at electrodes made of Al, etc., of semiconductor elements may be formed by using a so-called wire bonding. If substantially lead-free bumps of Au, Ag, Cu, Pd, etc., are formed, it is not necessary to use lead, contained in solder, which is harmful to the human body, and no cleaning process of electronic elements, which is one of the causes of the environmental contamination of the earth, is required. Bumps maybe formed by a so-called transfer method. Furthermore, a conductive plated resin ball which is produced by forming a Au or the like plated film on the surface of a resin spherule having elasticity may be employed instead of the Au bumps.

That is, the production method and structure of high-density mounted modules of MCM, hybrid ICs or the like according to the invention are featured in that by the mounting method of semiconductor elements and the hermetic sealing manner thereof, the semiconductor elements are assembled and formed in only processes in which no solder containing harmful substances to the human body such as lead, etc is used.

Furthermore, forming a thin film made of resin having wiring circuits on the surface of the substrate, the multi-chip module having accurately located a wiring pattern, a mounting pad and a bonding pad is produced. Also no process is required to correct the unevenness of the positional accuracy of wiring pattern, mounting pad and bonding pad due to shrinkage through co-firing green sheet process.

In a case where a thin film having a circuit made of copper-polyimide is formed on a multi-layered substrate in which ceramic, etc., is used as an insulating material, the bonding of a ceramic multi-layered substrate with a weld ring should be carried out at a temperature which is lower than the heat resisting temperature of polyimide. The ceramic substrate soldered to the weld ring with, for example, Au/Sn, Au/Ge, etc. to do so.

Still furthermore, in the invention, a conductive resin, an anisotropic conductive film, or a conductive paste layer, the main constituent of which is, for example, Ag or the like, is formed on a mounting pad including die pad and O.L.B. pad on which semiconductor elements formed on the surface of a substrate made of inorganic materials such as ceramic or electronic elements such as resisters and capacitors are incorporated. Various kinds of electronic elements are mounted on this mounting pad, and semiconductor elements or chip components such as resistors, capacitors, or the like are supported and fixed on a multi-layered wiring substrate by heating and curing the substantially lead-free conductive materials. Thereafter, the semiconductor elements and multi-layered wiring substrate are electrically connected by an Au or the like wire bonding method. Furthermore, in order to seal and make the mounting area of a substrate hermetic, an opening end of the metal cap is placed onto a weld ring brazed onto the second area, which surrounds the first area where electronic elements are mounted, with a lead-free soldering material in advance, whereas a laser beam is irradiated to the opening end of the metal cap and the surface of the weld ring, or seam welding is carried out. Thereby they are made hermetic.

Therefore, according to the invention, it is not necessary to use lead contained in solder, which is harmful to the human body, and no cleaning process of electronic elements, which is one of the causes of the environmental contamination of the earth, is required.

In the invention, electrodes formed at electronic elements such as chip resistors, chip capacitors, etc. to form an electrical connection with the mounting pads are formed of a deposited metal film made of, for example, only Ag, Pd, Ag/Pd or the like. No plated layer made of solder containing lead (for example, Sn:Pb=63:37) or the like is used at all.

That is, the production method and structure of high-density mounted modules of MCM, hybrid ICs or the like according to the invention are featured in that by the mounting method of semiconductor elements or chip components such as resistors, capacitors, etc., and hermetic sealing manner thereof, the semiconductor elements are able to be assembled and formed in only processes in which no solder containing harmful substances to the human body such as lead, etc. is used, and the invention is characterized in providing a process and production method in which no cleaning process is required at all.

Thus, according to the invention, there is practically no need to use flux, and no cleaning process is used. Therefore, since it is not necessary to use any flux which may spoil the reliability, it is possible to provide multi-chip modules of high reliability. Still furthermore, according to the invention, no cleaning process will be required for multi-chip modules, the number of the production processes is decreased, and since no defect resulting from deformations of Au or Al fine wires in a cleaning process is caused, the yield of production will be much improved. Therefore, it is possible to provide multi-chip modules with the production cost decreased, at a high productivity.

In addition, the invention is not only adopted for a multi-chip module but also adopted for a semiconductor package.

DESCRIPTION OF THE PREFERRED EMBODIMENTS

First embodiment

Figure 1:
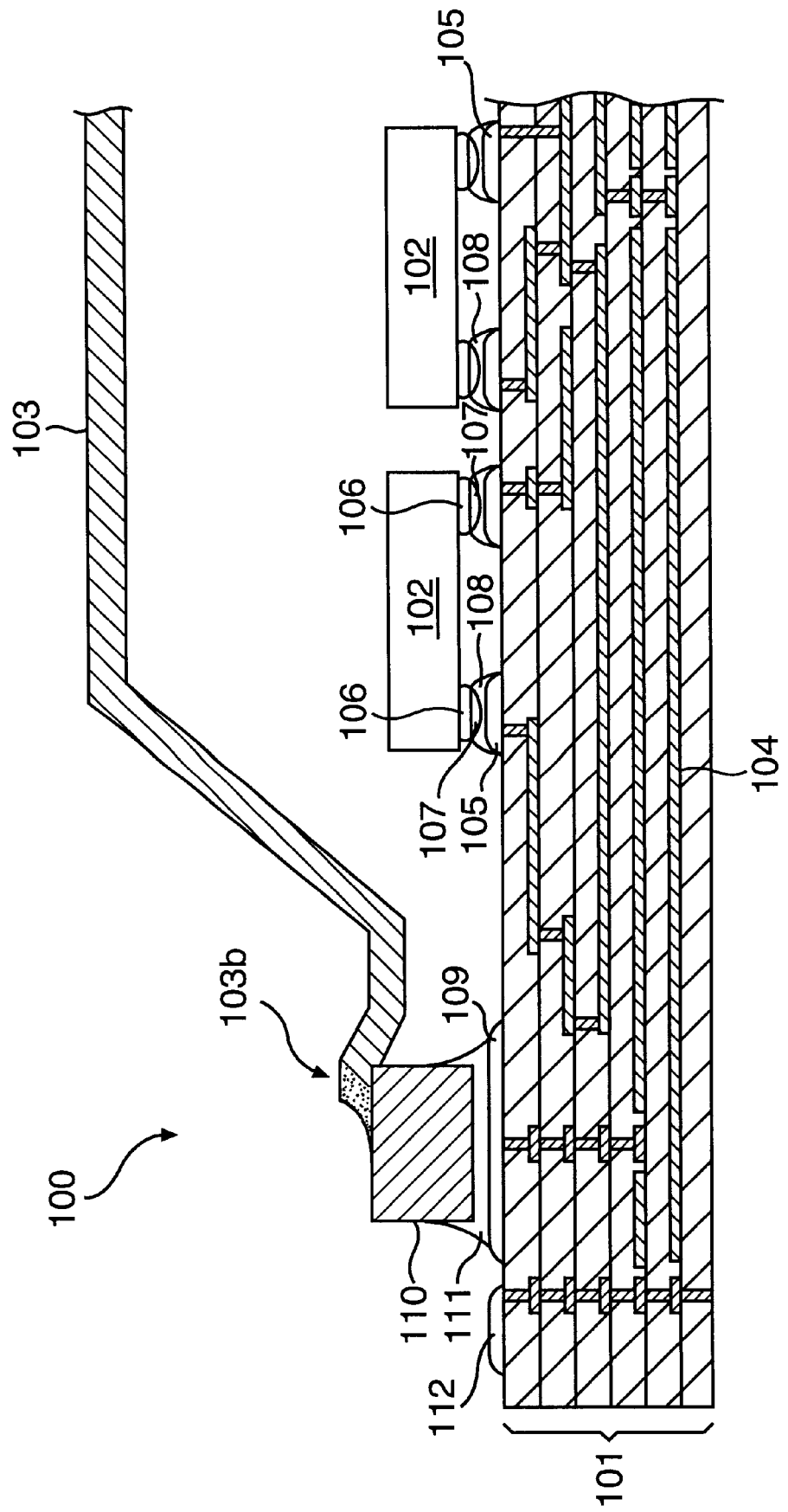
FIG. 1 is a cross-sectional view showing the construction of a multi-chip module according to the invention.

FIG. 1 is a cross-sectional view showing the construction of a multi-chip module according to the invention.

Figure 2:
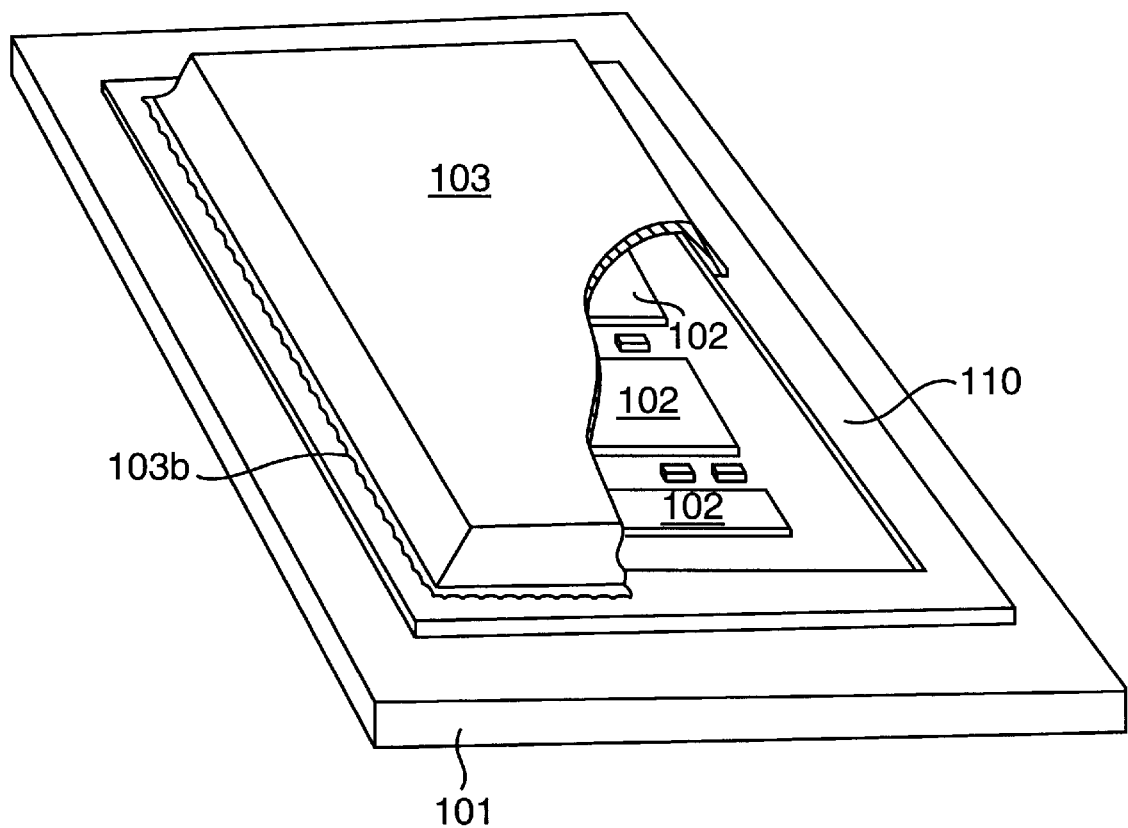
FIG. 2 is a perspective view of a multi-chip module according to the invention.

FIG. 2 is a perspective view of a multi-chip module illustrated in FIG. 1.

The multi-chip module is such that a plurality of electronic elements including semiconductor elements 102 which are mounted in a face-down type on the first surface of a substrate 101 which is a ceramic multi-layered substrate. The area where electronic elements of the substrate are mounted is covered by a metal cap 103 and sealed hermetically.

Mounting pads (O.L.B. pads : outer lead bonding pads) 105 connected to wiring circuits 104 are formed on the first surface of the substrate 101. The wiring circuits 104 and mounting pads 105 are essentially made of tungsten (W), and thin Au/Ni plating layer is formed on the surface of these pads. A connecting means (not illustrated) with the peripheral circuits such as mother board is formed on the second surface of the substrate 101 or the first surface of the substrate that are illustrated as 112. As the connecting means, for example, PGA (Pin grid array), BGA (Ball grid array), LGA (Land grid array) or the like may be used. Furthermore, the connecting means may be also formed, not on the second surface, but at the side of the substrate, which is a still outer area of the metal cap of the first surface. The substrate 101 was formed by a green sheet process with a co-firing method.

Semiconductors 102 are bare chips, wherein Al electrodes (I.L.B. pads) 106 and Au ball bumps 107 are formed on the first surface thereof. The bumps 107 are formed of Au, Ag, Cu, Pd, Ni, Cr, Ti for example. Furthermore, for example, the bumps are formed by, for example, a wire bonding method or plating method. Still furthermore, they are formed of resin spherule on which Au, Ag, Cu, Pt or the like are plated.

The semiconductor element 102 is disposed in such a manner that the first surface thereof is opposite to the first surface of the substrate 101. The semiconductor element 102 and substrate 101 are disposed so that their connecting locations are consistent with each other.

The mounting pads (O.L.B. pads) 105 of substrate 101 and the bump 107 of semiconductor element 102 are electrically and mechanically connected to each other by substantially lead-free conductive paste (resin) 108 for which Ag is used as conductive particles. For example, Ag, Cu, Au, Pd, Pt and other metals except lead are used as substantially lead-free conductive particles. These substantially lead-free metals can be used in combination. A binder materials of the conductive resin 108 is epoxy resin, for example, wherein the connection is established by curing the same through heating. As a substantially lead-free conductive paste (resin) 108, ESL-8881 can be used, for example.

A sealing pattern 109 made of W on which thin Ni plating layer are formed at the area which encloses the area of the substrate 101, at which electronic elements are mounted. The sealing pattern 109 was formed simultaneously with the mounting pads (O.L.B. pads) 105.

A weld ring 110 made of Kovar is brazed onto the sealing pattern 109 with silver copper eutectic alloy ill. After brazing process, Au/Ni plated layer is formed on all the pads and patterns on the ceramic substrate surface. The metal cap is also made of Kovar. The metal cap 103, the opening envelope of which is disposed opposite to the weld ring 110, is connected by a deposited zone 103b. The deposited zone 113b formed by, for example, causing the weld ring 110 and metal cap 103 to be laser-welded or seam-welded.

Furthermore, the room inside the multi-chip module 100, which is sealed by the metal cap 103 is filled with noble gases such as He, Ar or the like or nitrogen gas.

Figure 3:
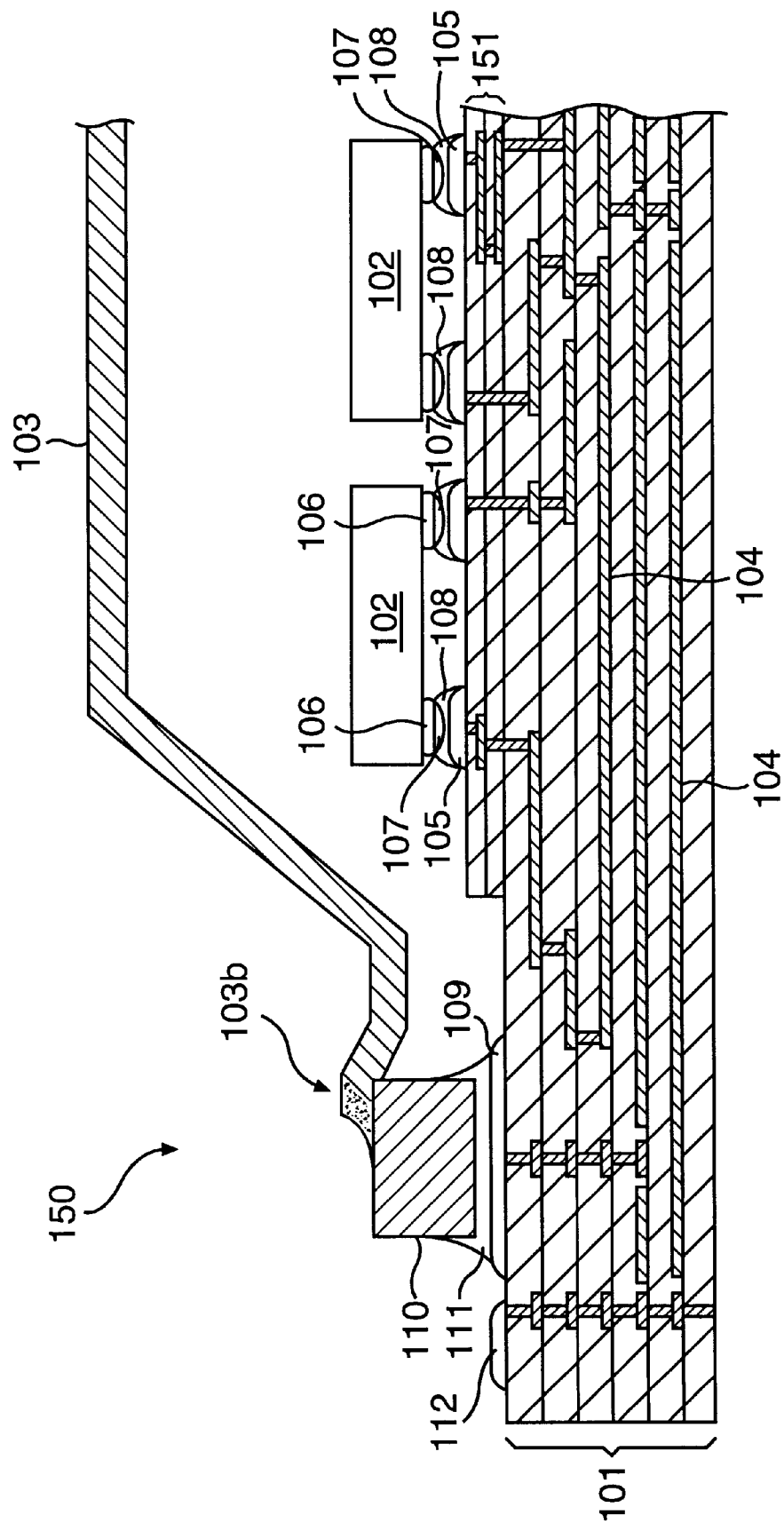
FIG. 3 is a cross-sectional view showing the construction of a multi-chip module according to the invention.

FIG. 3 is a view showing a modified example of a multi-chip module of the invention, illustrated in FIG. 1. At the multi-chip module 150, a thin film 151 having wiring circuits made of polyimide and copper is formed on the first area of the first surface of the substrate 101.

As described above, forming thin film having circuits on the first area of the first surface of multi-layered substrates, it is possible to correct the unevenness of the positional accuracy of conductor patterns due to shrinkage through co-firing process.

Since the dielectric constant e of polyimide is about 3.2 to about 3.4 while the dielectric constant $\epsilon$ of the insulating layer of ceramic substrate is about 9 to about 10, the capacitance made by wiring pattern decreased, whereby the signal transfer characteristics is also improved, and a multi-chip module suitable for highspeed response is provided.

The insulating layer of thin film 151 is formed of, for example, BCB ($\epsilon$ is about 2.8 to about 3.2), teflon ($\epsilon$ is about 2.2 to about 2.4) or the like. Furthermore, the conductor layer of thin film circuits 151 is formed of, for example, Au.

FIG. 4, FIG. 5, FIG. 6 and FIG. 7 are views explaining the production methods of multi-chip module according to the invention.

Figure 4:
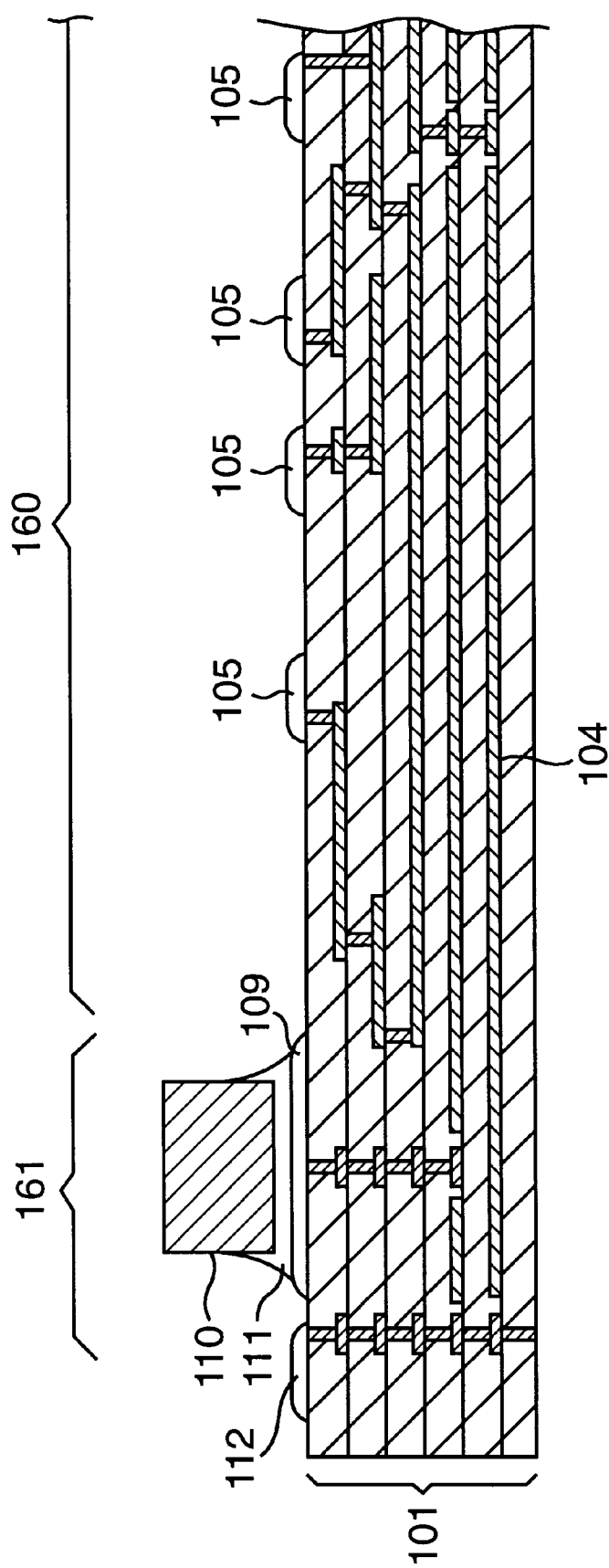
FIG. 4, FIG. 5, FIG. 6, and FIG. 7 are views explaining the production methods according to the invention.

Firstly, mounting pad (O.L.B. pads) 105 are formed inside the first area 160 of the first surface of the substrate 101, which is an area where electronic elements are mounted, and a sealing pattern 109 is formed by tungsten paste screen printing at the second area 161 which encloses the first area 160 (FIG. 4). The mounting pads (O.L.B. pads) 105 and sealing pattern 109 may be formed simultaneously with the substrate forming process. And weld ring 110 made of Kovar is brazed onto the sealing pattern 109 with silver copper eutectic alloy 111. After this brazing process, Au/Ni plated layer is formed on all the pads and patterns. It is also available to form Ni plated layer on these pads and patterns made of tungsten firstly, and to form Au/Ni plated layer on the Ni plated layer secondly.

Figure 5:
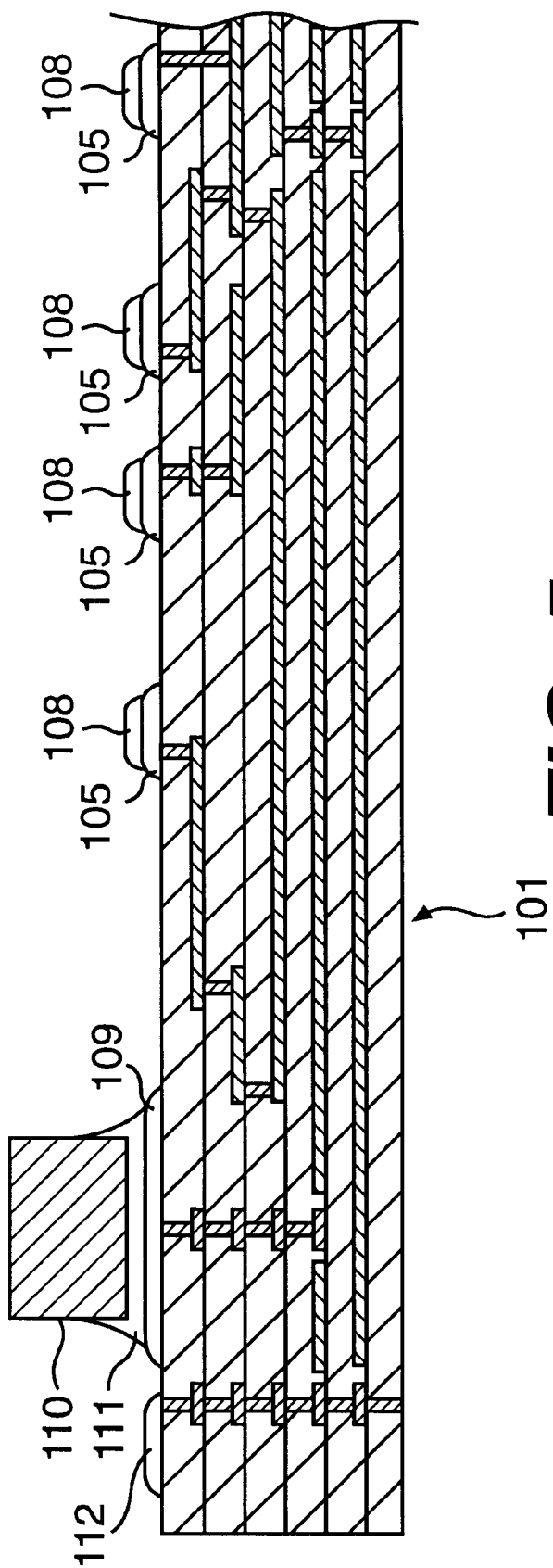

Next, substantially lead-free conductive resin 108 is disposed on the mounting pads 105 (O.L.B. pads) (FIG. 5). The conductive resin 109 is formed by, for example, a screen printing method, dispense method, transfer method, direct depicting method or other methods.

Figure 6:
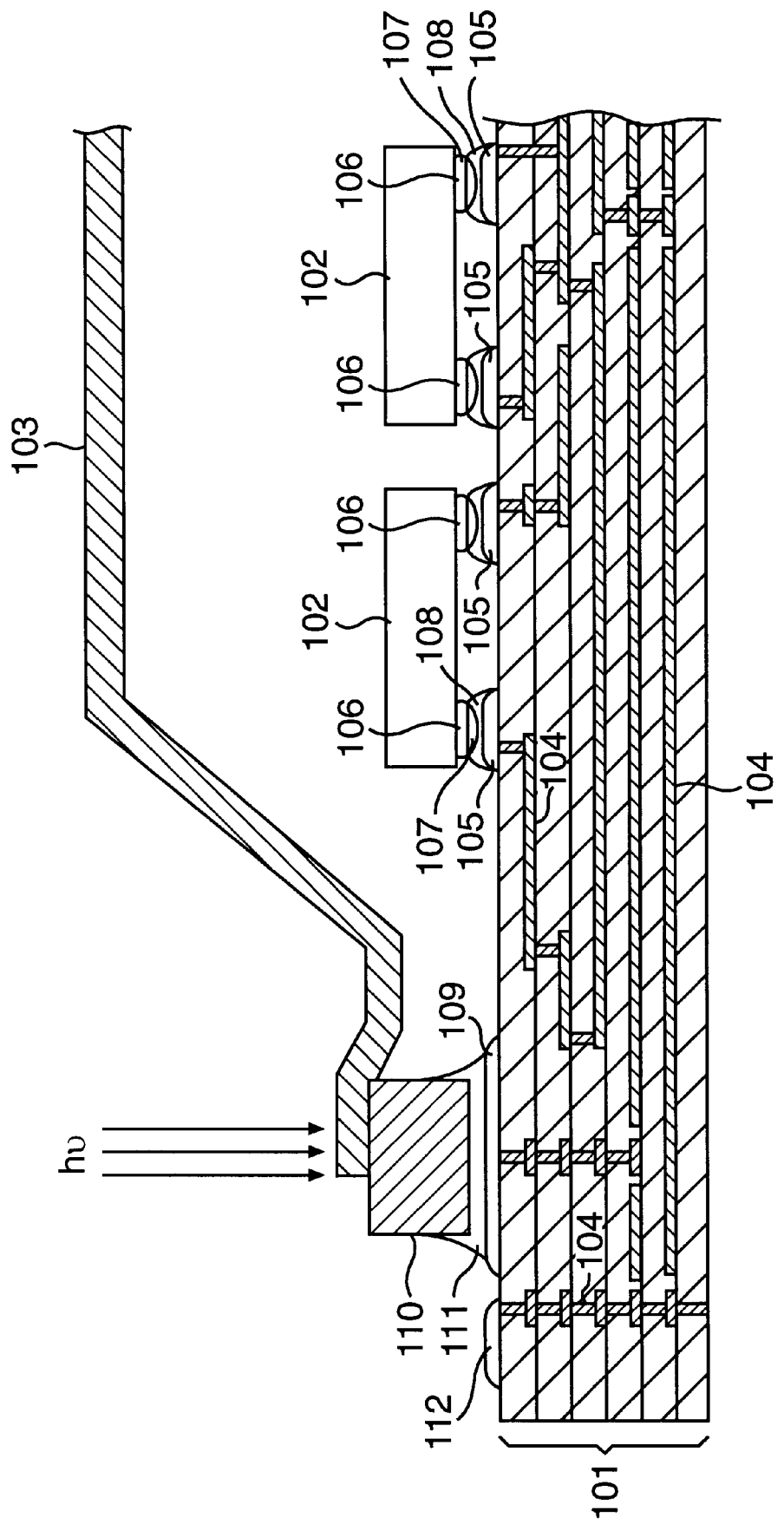

The semiconductor 102 on which substantially lead-free bumps are formed is disposed so that the first surface thereof is opposite to the first surface of the substrate 101 (FIG. 6). At this time, the substrate 101 and semiconductor element 102 are disposed so that the connecting locations thereof are consistent with each other. After other electronic elements are loaded, the conductive resin 108 is cured by heating, whereby the mounting pads 105 (O.L.B. pads) and bumps 107 which are formed at I.L.B. pads are electrically and mechanically connected to each other.

As described above, after electronic elements including the semiconductor elements 102 are mounted at the first area 160 of the first surface of the substrate 101, the metal cap 103 is disposed so that the opening envelope thereof is placed in face with the weld ring 110. A deposited zone is formed between the metal cap 103 and weld ring 110 by irradiating a laser beam onto the rim of the metal cap 103. Furthermore, this process is carried out in the atmosphere of noble gases or nitrogen gas, whereby the room sealed inside the metal cap 103 of the multi-chip module 100 is filled with noble gases or nitrogen gas, and the reliability and the stability of the multi-chip module are promoted.

Figure 7:
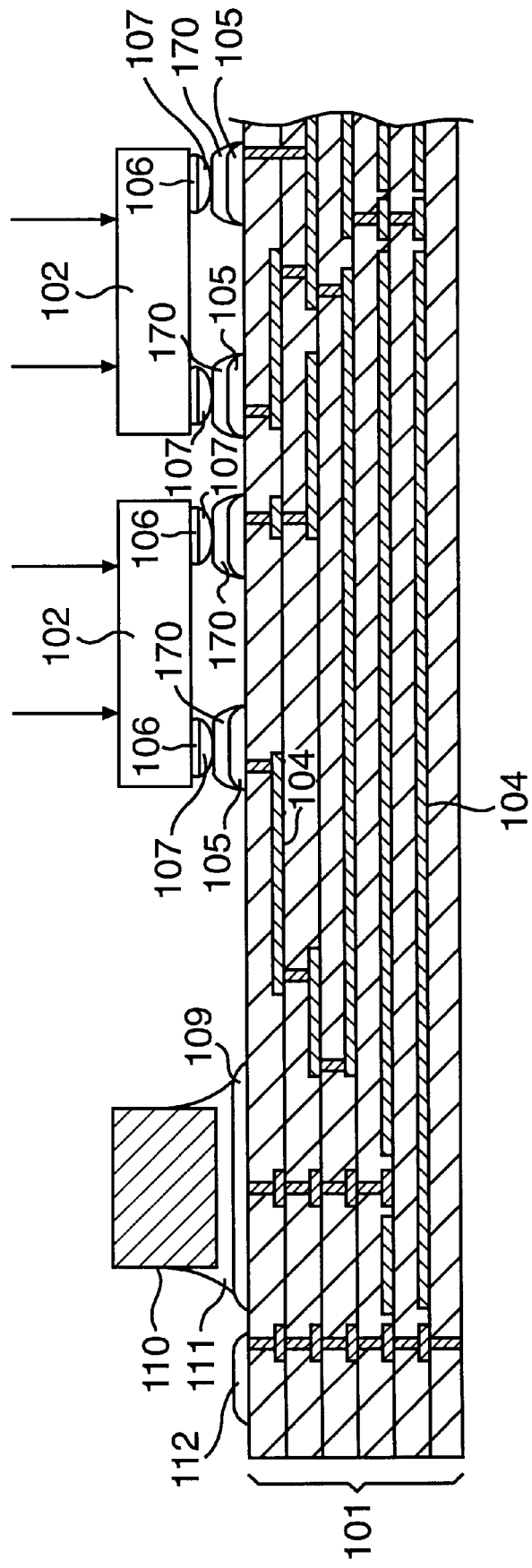

FIG. 7 is a view explaining a production method according to the invention, wherein an anisotropic conducting film is employed as a lead-free bonding means.

That is, an anisotropic conducting film in which Ag is used as a conductive particles is disposed on the mounting pad 105. Next, the semiconductor element 102 on which substantially lead-free bumps 107 is disposed in face with the first surface thereof and the first surface of a substrate 101. At this time, the substrate 101 and semiconductor element 102 are disposed so that their connecting locations are consistent with each other. By pressing the substrate 101 and semiconductor element 102 and simultaneously heating them, the mounting pads 105 and bumps 107 are electrically and mechanically connected to each other.

In addition, the invention is not only adopted for a multi-chip module but also adopted for a semiconductor package.

Second embodiment

Figure 8:
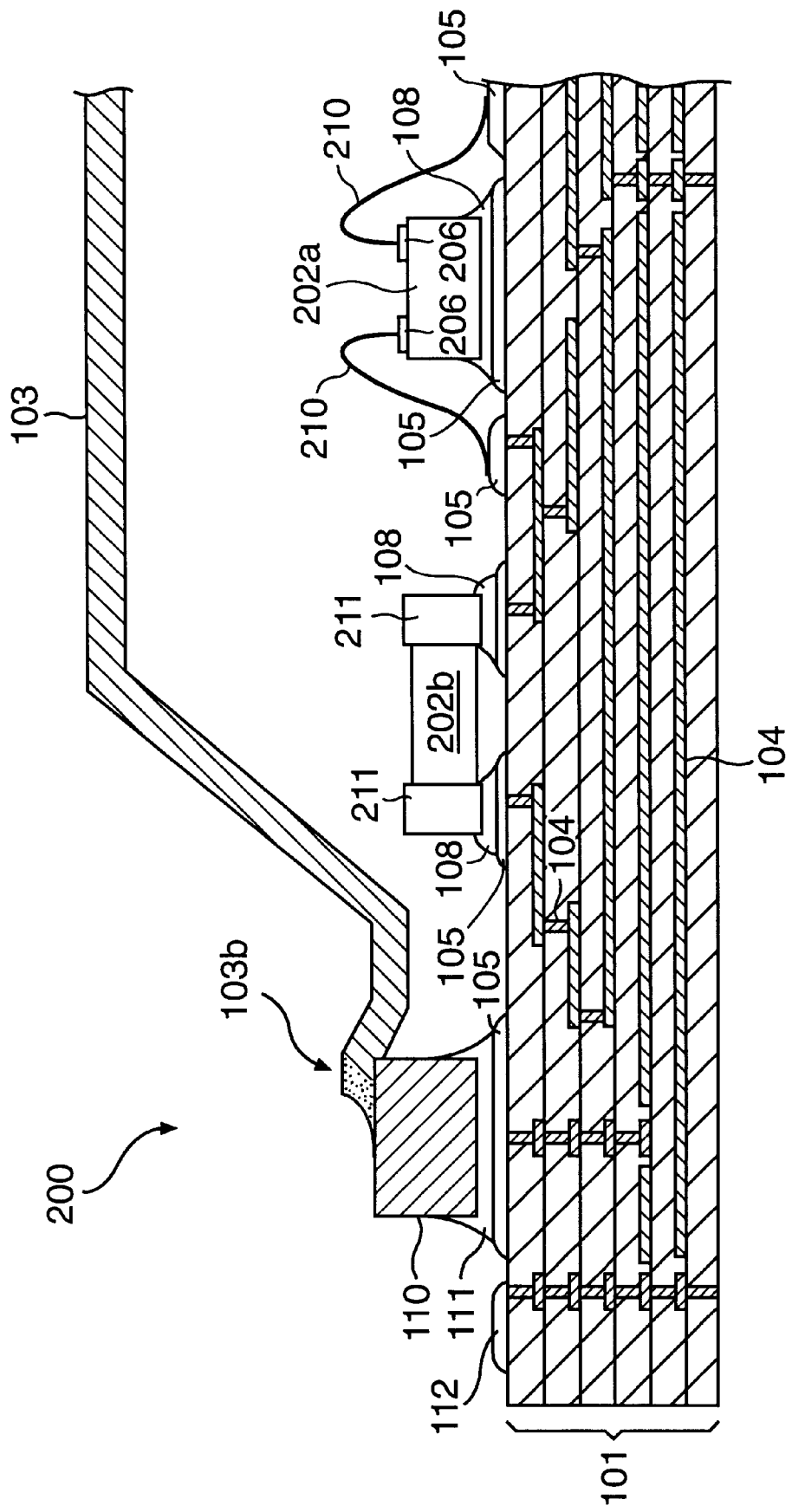
FIG. 8 is a cross-sectional view showing the construction of a multi-chip module in another preferred embodiment of the invention, FIG. 9 a cross-sectional view showing the construction of a multi-chip module In another preferred embodiment of the invention.

FIG. 8 is a cross-sectional view of another construction of a multi-chip module according to the invention.

This multi-chip module 200 is such that a plurality of electronic elements including a semiconductor element 202a and chip resistor 202b which are face-up bonded on the first surface of a substrate 101 which is a ceramic multi-layered substrate, and the area where electronic elements of the substrate 101 is hermetically sealed by a metal cap 103.

The mounting pads (die pads and O.L.B. pads) 105 which are connected to the wiring circuits 104 are formed on the first surface of the substrate 101. The wiring circuits 104 and mounting pads 105 are made of tungsten (W). Thin Ni/Au plating layer is formed on the surface of the mounting pads 105. Input/Output pad 112 is formed on the outside of the sealing pattern 109 which formed on the first surface of the substrate 101. A connecting means with the peripheral circuits (not illustrated) also could be formed on the second surface of the substrate 101. PGA (Pin grid array), BGA (Ball grid array), LGA (Land grid array) or the like are the examples of the connecting means. Furthermore, the connecting means are also formed, not on the second surface, but at the side of the substrate, which is a still outer area of the metal cap of the first surface (i.e. I/O pad 112). The substrate 101 was formed by a green sheet process and co-fired.

Semiconductors 202a are bare chips, wherein Al electrodes (I.L.B. pads : Inner Lead Bonding pads) 206 are formed on the first surface thereof. A metallized layer (not illustrated) is formed on the second surface of the semiconductor elements 202a.

The semiconductor 202a is disposed so that the second surface thereof is opposite to the first surface of the substrate 101. The mounting pad (die bonding pad) 105 of the substrate 101 and the second surface of the semiconductor elements 202a are mechanically bonded to each other by approximately lead-free conductive resin 108 in which Ag is used as a conductive particles. For example, Ag, Cu, AU, Pd, Pt and other metals are employed as the conductive particles, and also employed in combination. A binder materials of the conductive resin 108 is epoxy resin, for example, and the connection thereof is established by curing the resin through heating.

Furthermore, the example shown in FIG. 8 is constructed so that the second surface of the metallized semiconductor elements 202a is retained at a reference potential by a wiring pattern (not illustrated). The metallized layer becomes not only a barrier which is able to function to prevent metal from being diffused from the conductive resin layer but also a shield against noise from the outside.

On the other hand, the electrode (I.L.B. pad) 206 formed on the first surface of the semiconductor element 202a and mounting pad (die bonding pad) 105, formed on the substrate 101, which is connected to the wiring circuit 104 are bonded by a bonding wire 210 made of Au.

Furthermore, the chip resistor 202b has a deposited film 211 in which the electrode thereof is made of an alloy of Ag and Pd. No lead-contained solder formed on the electrode of these elements. Passive elements for surface mounting, for which the electrode thereof does not have any lead-contained coated film are produced and employed for this invention.

A sealing pattern 109 made of tungsten (W) is formed at the area which encloses the area, where electronic elements are mounted, of the substrate 101. The surface of the sealing pattern, there is Ni/Au plated layer is formed. As described in the first embodiment, a weld ring 110 made of Kovar is brazed onto the sealing pattern 109 with silver copper eutectic alloy 111. And, the weld ring 110 and metal cap 103 are bonded by a deposited zone 113b.

Furthermore, The room sealed inside the metal cap 103, of the multi-chip module 200 is filled with noble gases such as He, Ar or nitrogen gas, which promotes the reliability and stability of the multi-chip module.

Figure 9:
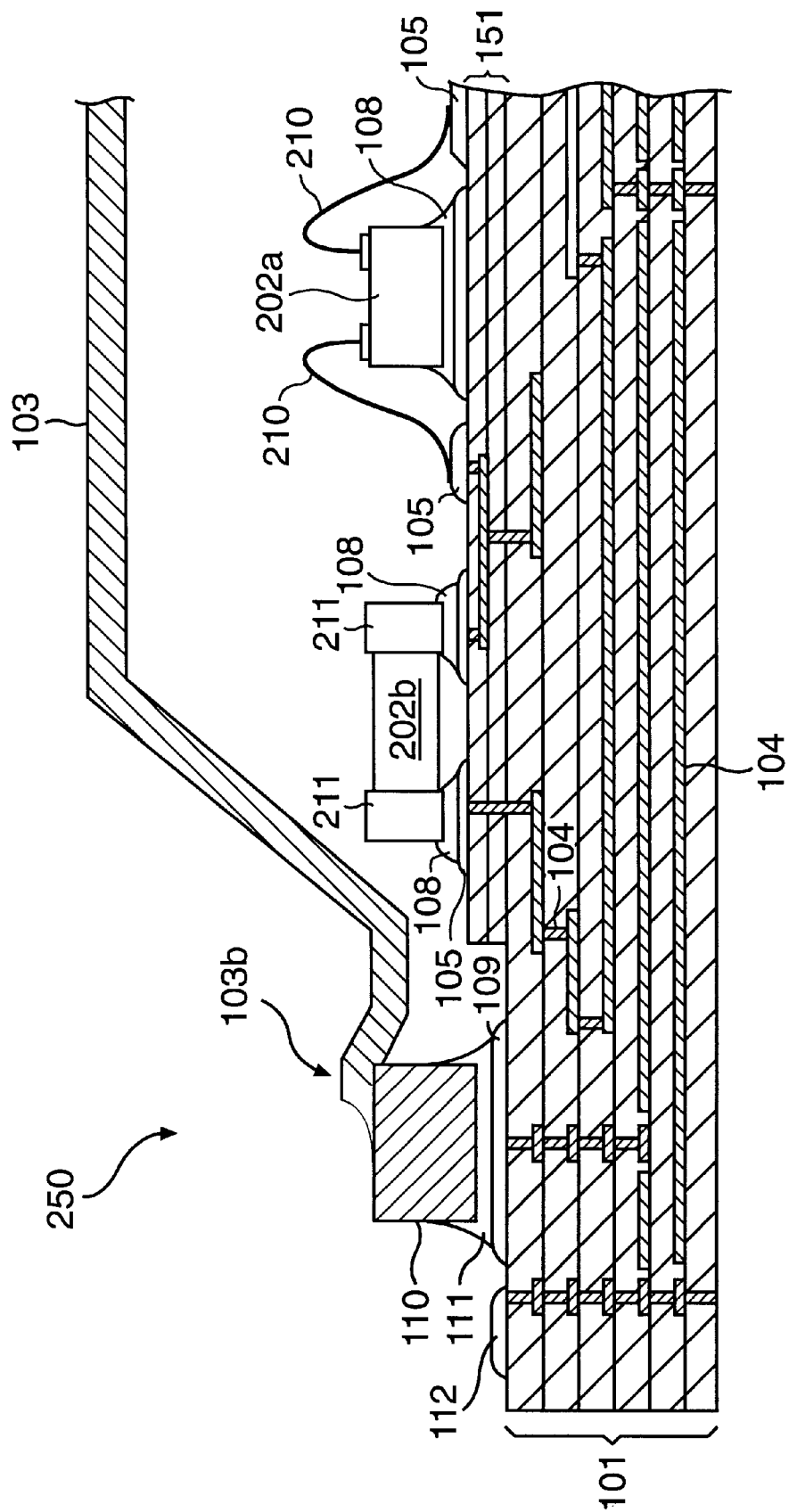

FIG. 9 is a cross-sectional view showing an another version of a multi-chip module according to the invention, shown in FIG. 8. In this multi-chip module 250, a thin film made of polyimide 151 having circuits made of copper is formed on the first surface of the substrate 101. The construction of the thin film 151 is identical to that shown in FIG. 3.

Figure 10:
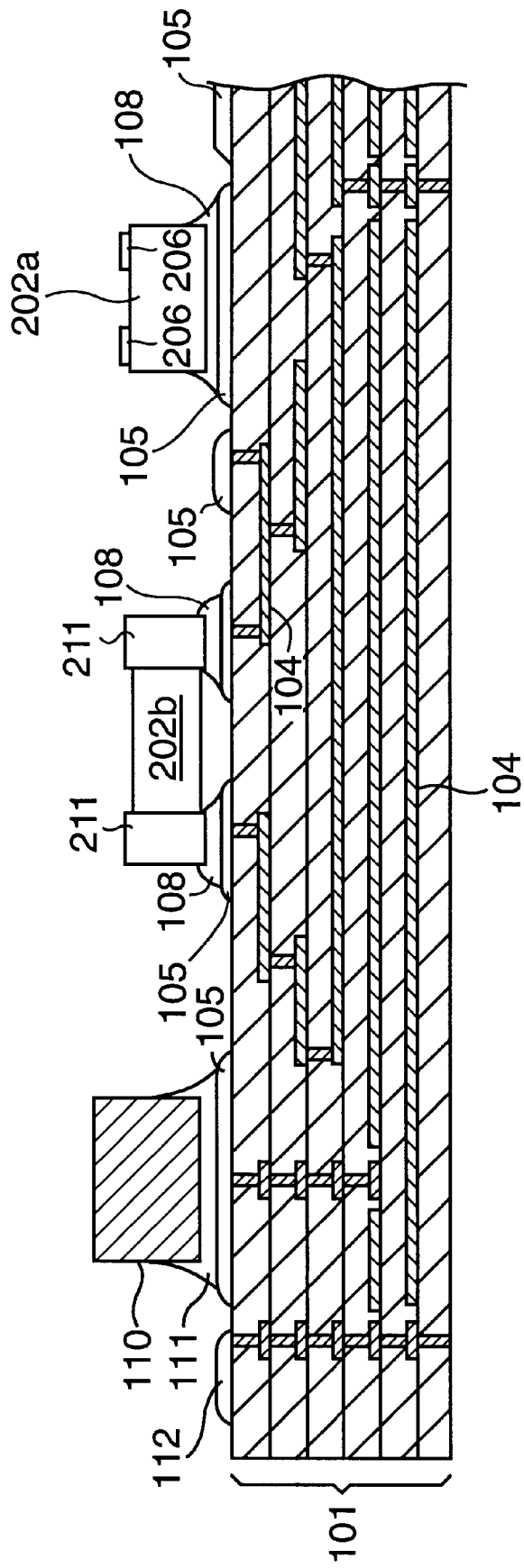
FIG. 10 is a view explaining the production method in another preferred embodiment of the invention.

Next, FIG. 10 is a view explaining a production method of a multi-chip module, shown in FIG. 8, according to the invention.

By a method similar to that in the first embodiment, mounting pads (die pads and O.L.B. pads) 105 are formed inside the first area 160 which is the electronic elements mounted area of the first surface of the substrate 101, and sealing pattern 109 are formed at the second area which encloses the first area (see FIG. 4). A weld ring 110 made of Kovar is brazed onto the sealing pattern 109 with silver copper eutectic alloy. After brazing, all the pads and patterns on the ceramic substrate are Au/Ni plated.

Then, substantially lead-free conductive resin 108 is disposed on the mounting pads 105 (see FIG. 5).

The semiconductor elements 202a, the second surfaces of which are metallized, are disposed so that the first surfaces thereof are opposite to the first surface of the substrate 101

(FIG. 10) At this time, the substrate 101 and semiconductor elements 202a are disposed so that their connecting locations are made consistent with each other.

The chip resistor 202b is disposed so that the deposited metal layer 211 formed on the electrode thereof is opposite to the mounting pad (die pad) 105 via the conductive resin 108.

Similarly, after other electronic elements are loaded, the conductive resin 108 is cured through heating, thereby causing the electrical and mechanical connection to be established.

The electrodes (I.L.B. pads) 206 formed on the first surface of the semiconductor 202a and the mounting pads (O.L.B. pads) 105, formed on the substrate 101, which is connected to thewiring circuit 104 are connected with a bonding wire made of Au.

After electronic elements including the semiconductor elements 202a are mounted at the first area 160 of the first surface of the substrate 101, the metal cap 103 and weld ring 110 are welded together as described in the first preferred embodiment.

Third embodiment

Figure 11:
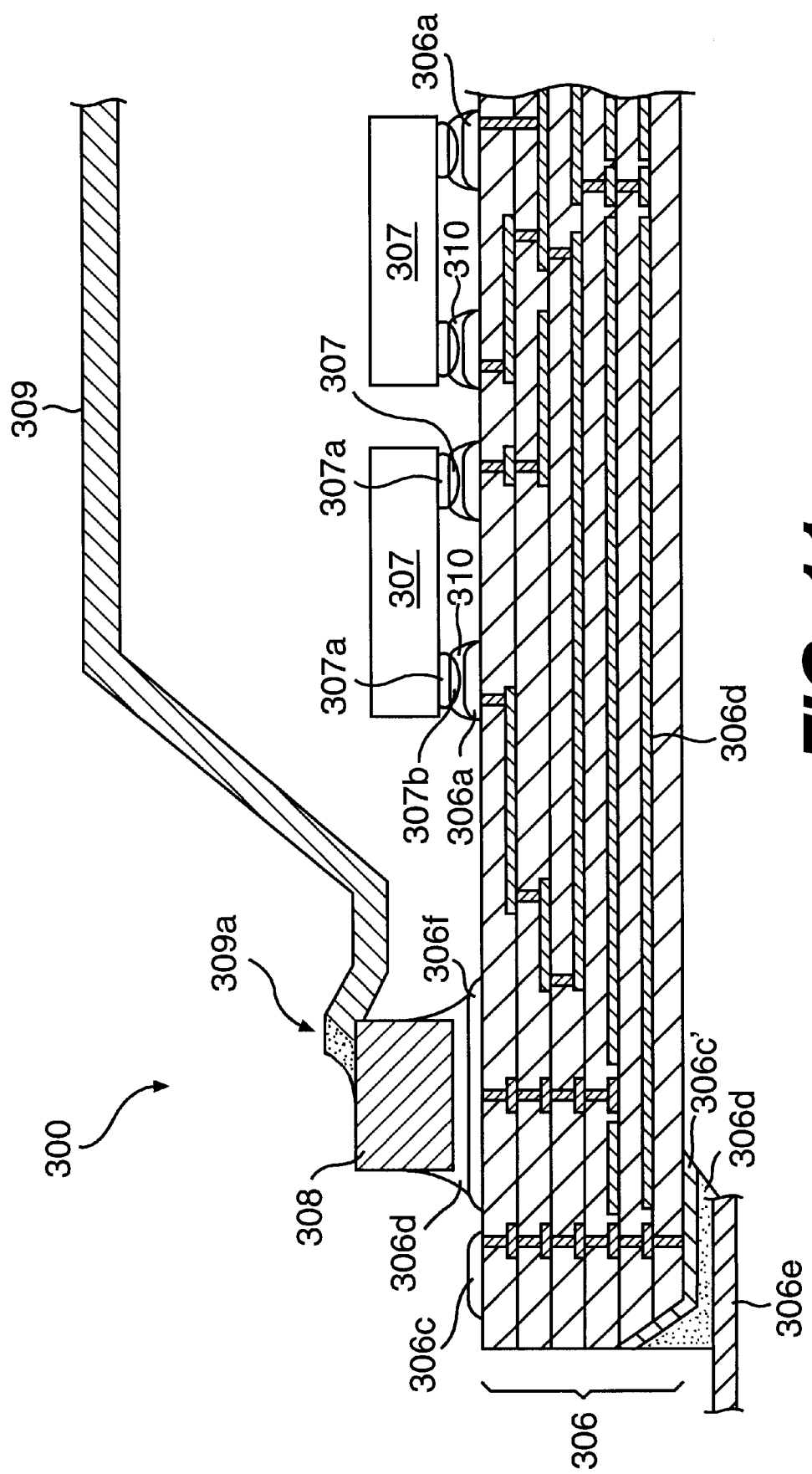
FIG. 11, FIG. 12, and FIG. 13 are cross-sectional views showing the construction of a multi-chip module according to the invention.

FIG. 11 is a cross-sectional view showing an example of the construction of major parts of a multi-chip module 300 according to the present embodiment. In FIG. 11, 306 is a co-fired thin film multi-layered wiring board in which ceramic such as alumina, etc. is used as an insulating material, wherein a wiring pattern including a mounting pad 306a which will be a portion to be connected, is provided in an appointed area of one major face of the thin film multi-layered wiring board. 307 is a semiconductor element on which an Al electrode 307a corresponding to the mounting pad 306a of the thin film multi-layered wiring board 306 is electrically connected and mounted (in such a manner as a face-down type mounting), 308 is a weld ring, made of, for example, Kovar or Fe/Ni 42 alloy, etc., which is integrally brazed with Ag-solder 306d to the ceiling pattern 306f face of the thin film multi-layered wiring board 306 so as to enclose the mounted area of the semiconductor elements 307, 309 is a metal cap, the opening edge portion 309a of which is welded and sealed in a hermetic state to said weld ring surface, for sealing said semiconductor element 307.

Herein, thin film multi-layered wiring board 306 is internally provided with an appointed signal wiring pattern layer 306b such as, for example, tungsten (W), where for example, alumina is made a between-layers insulating layer, and the pattern layers are adequately connected to each other, whereby the thin film multi-layered wiring board 306 is provided with input/output pads 306c, 306c', and input/output leads 306e, to which silver copper eutectic alloy 306d, 306d' are attached, or input/output pins (not illustrated), etc. Al electrode 307a of semiconductor element 307 is connected and mounted to the mounting pad 306a of the thin film multi-layered wiring board 306 by Ag-based substantially lead-free conductive resin 310, a major binder constituent of which is epoxy resin in which an Au bump 307b secured on the Al electrode 307a surface is disposed in advance on the mounting pad 306a surface by a printing method, etc. That is, the Au bump 307b secured on the Al electrode 307a surface of the semiconductor element 307 is caused to correspond to (positioned) and is disposed at the Ag-based substantially lead-free conductive resin 310 disposed on the mounting pad 306a surface, in which state the thin film multi-layered wiring board 306 and semiconductor element 307 are pressed and the substantially lead-free conductive resin 310 is hardened with the Au bump 307b buried in the approximately lead-free conductive resin 310, whereby the connection and mounting are completed. Furthermore, the opening edge portion 309a of metal cap 309 is welded onto the weld ring 308 surface by a laser beam irradiation and is hermetically sealed. Still furthermore, a seam welding method may be employed instead of a welding and hermetic sealing by this laser beam irradiation. However, in such a case, it is necessary to design the metal cap 309 to such a shape that the edge portion of the metal portion 309 is nearly coincident with the outer side face of the weld ring 308.

Multi-chip modules constructed as shown above were evaluated through an electric test and a reliability test which are usually carried out. In either case, the results were satisfactory. Also, in the above manufacturing process, since no solder containing Pb was used, the working efficiency and working environment were good. Furthermore, even though disposed electronic elements are exposed to precipitation (eg. acid rain), there is completely no worry that Pb is dissolved and enters soil. Therefore, even though underground water is drunk, there is no worry about disorder of the nervous system, adverse affecting of fecundity, anemia, hypertension, generation of carcinogen, etc. Still furthermore, since it is possible to eliminate a cleaning process with an organic solvent, no problem is constituted due to flux residues in a case where cleaning is performed after solder is used, whereby the invention greatly contributes to heightening the reliability of multi-chip modules, and suppresses generation of the environmental problems of the earth resulting in the destruction of the ozone layer.

Fourth embodiment

Firstly, a multi-layered wiring board which is provided, at an appointed area of the top surface layer thereof, with a mounting pad to be connected and a weld ring brazed with silver copper eutectic alloy, was produced by a co-firing process or green sheet process in compliance with a normal means, wherein alumina is used as an insulating material and W-based paste is used as a conductor. Thereafter, as in the first embodiment, a conductive paste layer was provided on the mounting pad face of the multi-layered wiring board. Next, bumps secured on the electrode are positioned on the mounting pads of the multi-layered wiring board, whereby semiconductor elements were disposed by a face-down process. The semiconductor elements were pressed to the multi-layered wiring board and the bumps were penetrated in the conductive paste layer. In this state, the conductive paste layer was hardened to ensure electrical and mechanical connections thereof. Next, the opening edge of a metal cap was positioned at the weld ring of the multi-layered wiring board, whereby a multi-chip module was hermetically sealed by irradiating a laser beam.

Furthermore, in conjunction with a hermetic sealing of the metal cap, the results similar thereto are able to be obtained by employing a seam welding method instead of irradiation of a laser beam.

Fifth embodiment

An in-layer wiring type multi-layered wiring board was produced by a co-firing or green sheet process in compliance with a normal means, wherein alumina is used as an insulating material and W-based paste is used as a conductor. A Cu or Au based thin film, the thickness of which is 1 to 5 m or so, was formed on one major face of the in-layer type multi-layered wiring type multi-layered wiring board by a deposition or sputtering system. The top surface layer pattern including a mounting pad to be connected and was formed by photo etching said Cu, W, Ti, Ni, or Au based thin film. Subsequently, a weld ring was formed in a reduction type ambient hearth by brazing with Au solder. Under the same conditions as those in the first embodiment, an Ag-based paste layer was provided on the mounting pad face of the multi-layered wiring board, and the bumps provided on the electrode of semiconductor element were caused to correspond to and to be positioned at the mounting pad, whereby said semiconductor element was disposed in facedown. Thereafter, the semiconductor element was pressed onto the multi-layered wiring board, wherein the bumps were penetrated into the conductive paste layer. By curing the conductive paste layer with these bumps penetrated, electric and mechanical connections thereof were established, whereby the mounting thereof was also completed. Next, the opening end of a metallic cap was positioned at the weld ring of said multi-layered wiring board, whereby a multi-chip module was hermetically sealed by irradiating a laser beam.

Furthermore, in conjunction with a hermetic sealing of the metal cap, the results similar thereto are able to be obtained by employing a seam welding method instead of irradiation of a laser beam.

Furthermore, the invention is not limited to the above embodiments. It is needless to say that numerous variations and modifications are possible without deviating from the spirit of the invention and the scope of claims attached herewith. For example, a multi-layered wiring board may be made of nitrided aluminum based material, glass ceramic based material, etc. in addition to alumina-based material, and such a construction that input/output pins are caused to protrude from one major side instead of input/output leads may be employed. Still furthermore, in conjunction with Au, Cu, etc., which are formed at the electrode of semiconductor elements, for example, a wire bonding method, transfer method, plating method, etc. may be available, and any of them may be acceptable.

Sixth embodiment

Figure 12:
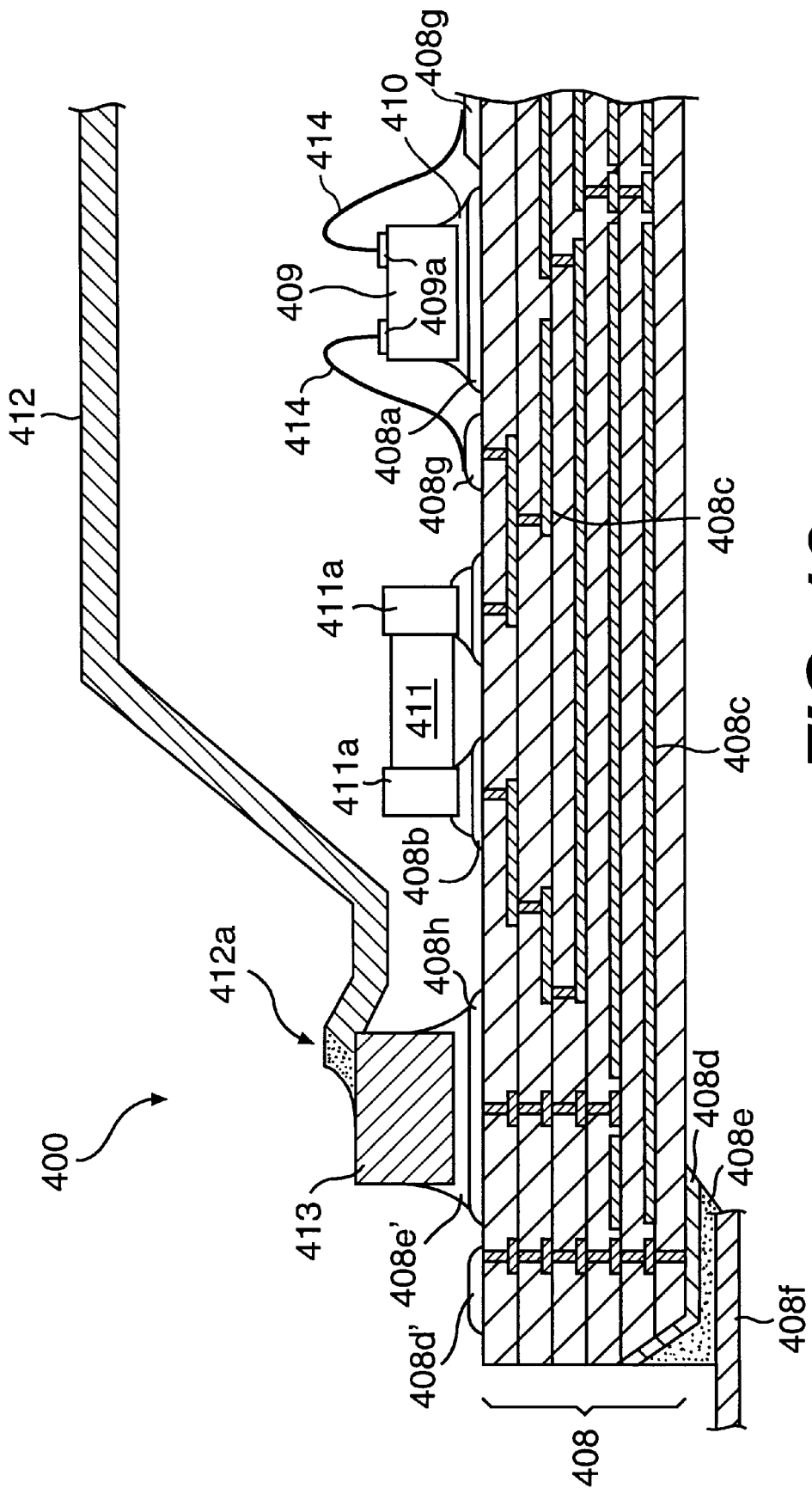

FIG. 12 is a cross-sectional view showing an example of the construction of major parts of a multi-chip module 400 according to the embodiment. In FIG. 12, 408 is a co-fired thick film multi-layered wiring board in which ceramic such as alumina is used as an insulator, and the thick film multi-layered wiring board 408 is provided with a wiring pattern including mounting pads 408a, 408b in an appointed area at one major face thereof. 409 is a semiconductor element (semiconductor chip) fixed with a conductive epoxy resin 410 at the mounting pad 408a of the thick film multi-layered wiring board 407, 411 is a passive element (chip-like resistor or capacitor) which is connected to the mounting pad 408b of the thick-film multi-layered wiring board 408 and fixed thereat with conductive epoxy resin 410, 412 is a metal cap which seals the semiconductor element 409 and passive element 411 with the opening edge 412a thereof deposited and hermetically sealed by laser beam irradiation at a weld ring 413 of the thick film multi-layered wiring board 408 in such a form that the same seals the loaded and mounted area of the semiconductor element 409 and passive element 411.

Herein, the Al electrode 409a of the semiconductor 409 fixed at the mounting pad 408a with conductive epoxy resin 410 is electrically connected to the mounting pad 408g of the thick film multi-layered wiring board 408 by a bonding wire 414. Furthermore, the electrode portion (Ag/Pd) of the passive element 411 is electrically connected to the mounting pad 408b. Electrodes of the passive components which are usually available on the market are coated with a solder plating of the same composition including Pb (Sn:Pb= 63:37). However, herein, the passive components are fixed with conductive epoxy resin in a state before solder plating.

Furthermore, the weld ring 413 is formed of, for example, Kovar or Fe/Ni 42 alloy or the like, and the same is integrally brazed with silver copper eutectic alloy 408e' to the sealing pattern 408h provided on the thick film multi-layered wiring board 408 in such a form that the sealing pattern 408h seals the loaded and mounted area of the semiconductor elements 409 and the passive elements 411.

Furthermore, the thick film multi-layered wiring board 408 is provided with appointed signal wiring pattern layers in the laminated layers thereof, wherein for example alumina is used as a between-layers insulating layer, and the pattern layers 408c are suitably connected to each other. The same is provided with input/output pads 408d, 408d' and input/output leads 408f brazed with silver copper eutectic alloy.

That is, hardening type conductive paste 410 is selectively disposed in advance on the mounting pads 408a, 408b of the thick film multi-layered wiring board 408 by a printing method, dispensing method or transfer method, wherein the corresponding semiconductor elements 409 and passive elements 411 are disposed and positioned. Subsequently, the hardening type conductive paste is hardened in this state, whereby the semiconductor elements 409 and passive elements 409 are fixed at and connected to appointed mounting pads 408a, 408b, electronic elements are sealed by a metal cap 412 by a laser beam irradiation after an appointed wire bonding 414 is completed, a soldering process is no longer needed, and a cleaning process by an organic solvent is also no longer needed. In all the other aspects, a multi-chip module is able to be produced in compliance with a generally known method. Furthermore, the opening edge 412a of the metal cap 412 is easily welded to the weld ring 413 and hermetically sealed, as required, by laser beam irradiation. However, a seam welding method may be acceptable for the welding and hermetical sealing instead of this laser beam irradiation method. But, in this case, it is necessary to design a metal cap 409 so that the edge portion of the metal cap 409 is coincidental with the outer side face of the weld ring 413.

As for multi-chip modules constructed above, electric tests and reliability evaluation tests, which are usually employed, were carried out. In either case, satisfactory results could be obtained. Still furthermore, since no solder containing Pb or the like is used, it is found that the working efficiency and working environment are also good.

Figure 13:
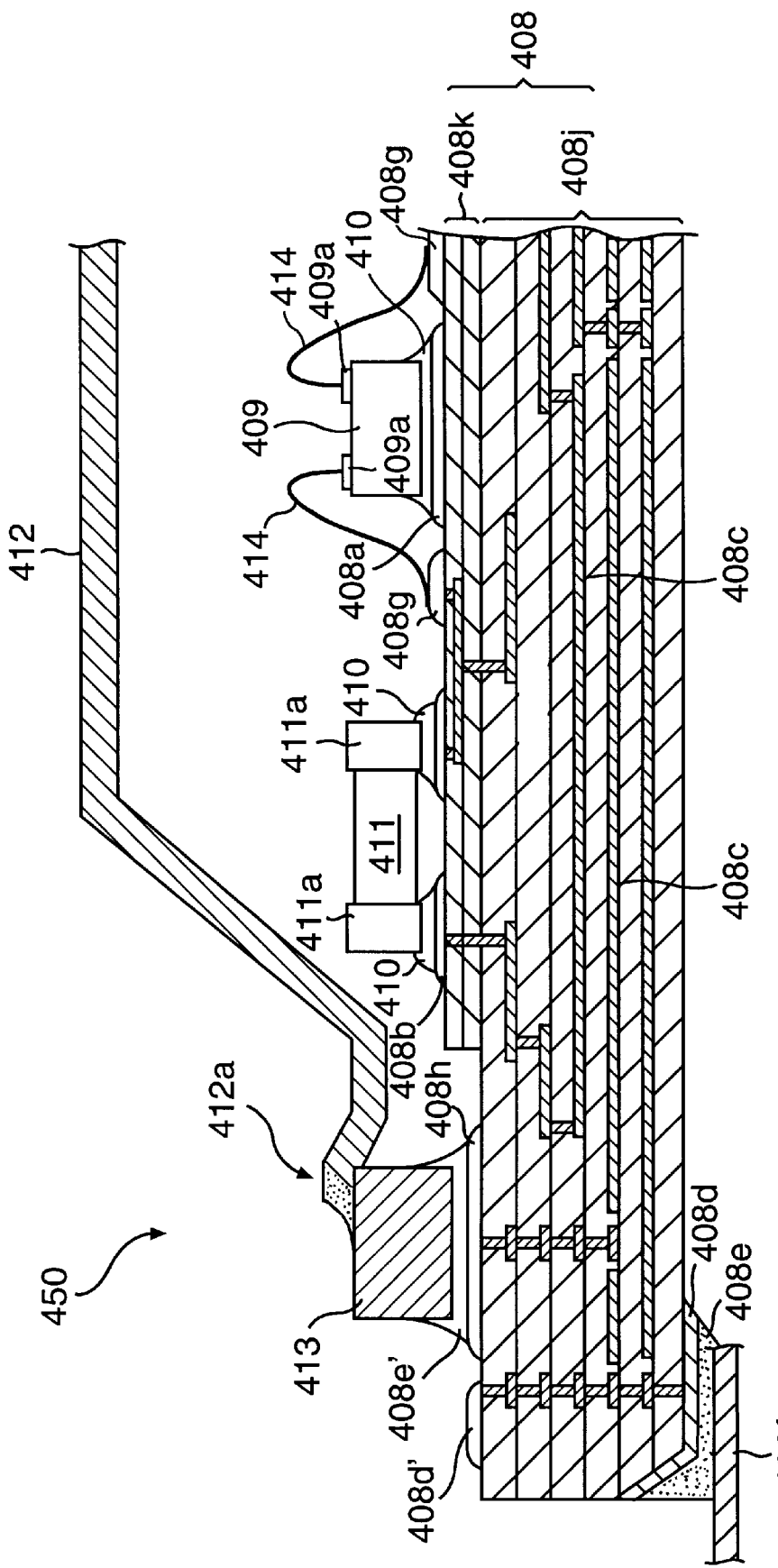
Figure 14:
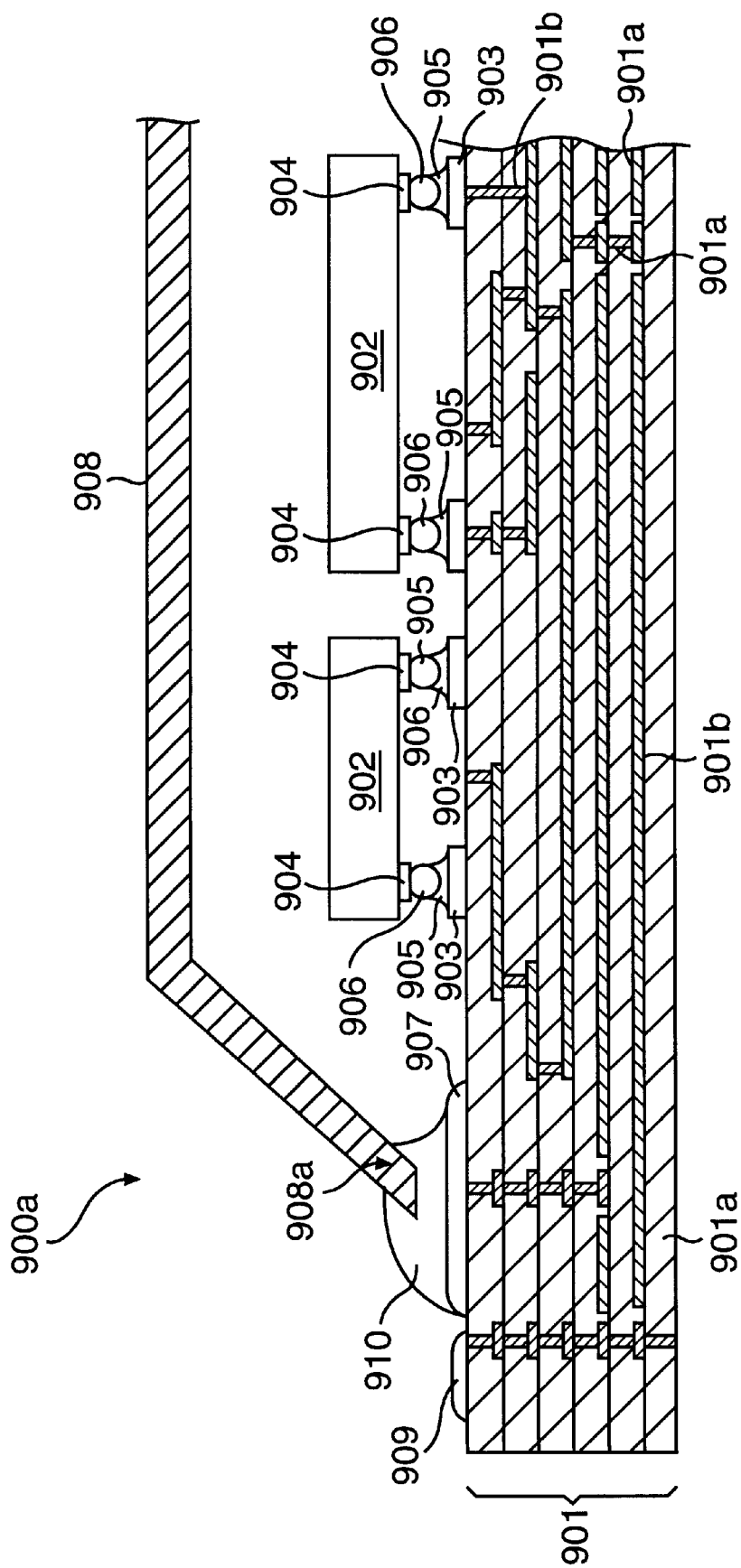
FIG. 14, and FIG. 15 are views showing a conventional multi-chip module.
Figure 15:
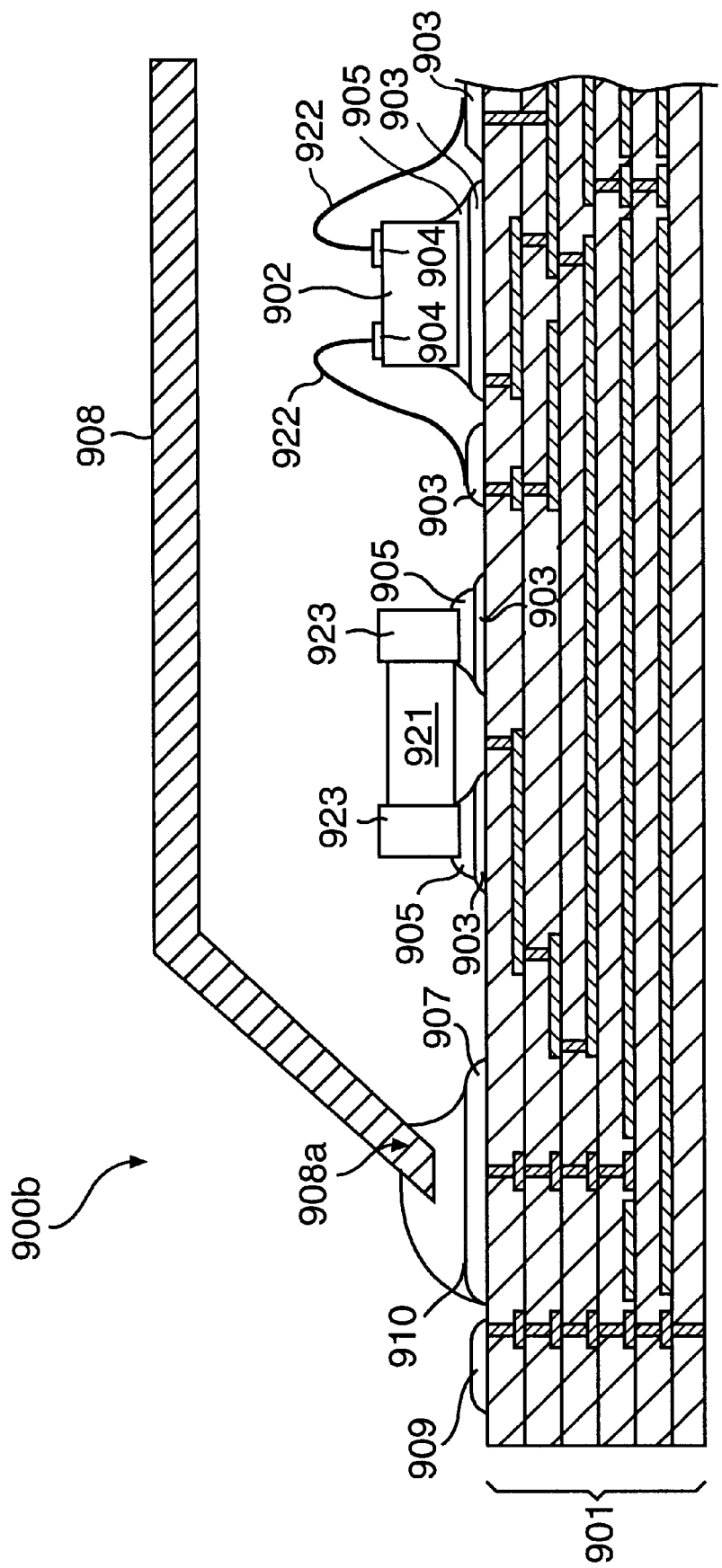

FIG. 13 shows, in the cross-section thereof, an example of construction of a multi-chip module for which highspeed actions of signals were attempted. The multi-layered wiring board 408 has a ceramic-based multi-layered wiring board 408k and a thin film multi-layered wiring layer 408j constructed so that, for example, a polyimide resin layer (insulating layer) and a copper wiring layer are alternately laminated on the ceramic-based multi-layered wiring board 408k, wherein the thin film multi-layered wiring layer 408j is used as a mounting area on which the semiconductor elements 409 and passive elements 411 are fixed or connected and fixed with conductive epoxy resin 410, and the semiconductor elements 409 and passive elements 411 are bonded to the mounting pads 408g of the thin film multi-layered wiring layer 408 by a bonding wire 414. The other construction is identical to that shown in FIG. 12. The multi-chip module was electrically tested and the reliability thereof was evaluated. It is found that the multi-chip module has functions of high reliability.

Seventh embodiment

A multi-layered wiring board 408 having a mounting pad 408g, mounting pads 408a, 408b, and sealing pattern 408h at an appointed area on the top surface layer thereof was produced by a co-firing or green sheet process in compliance with a normal means, wherein alumina is used as an insulating material and W-based paste is used as a conductor. Thereafter, a weld ring was formed on the sealing pattern 408h by Ag brazing in a reduction type ambient hearth. Next, as in the first embodiment, a conductive paste layer was provided on the mounting pads 408a, 408b of the multi-layered wiring board 408. After that, the semiconductor elements 409 and passive elements 411 were caused to correspond to the mounting pads 408a, 408b of the multi-layered wiring board 408 and were caused to be positioned and disposed at the connecting location. In this case, by hardening the conductive paste layer, the semiconductor elements 409 were mechanically fixed and the passive elements were electrically and mechanically connected. Next, the opening edge 412a of a metal cap 412 was positioned at the weld ring 413 of the multi-layered wiring board and hermetically sealed by laser beam irradiation to produce a multi-chip module.

Furthermore, in conjunction with a hermetic sealing of the metal cap, the results similar thereto are able to be obtained by employing a seam welding method instead of irradiation of a laser beam.

Eighth embodiment

Firstly, an in-layer wiring type multi-layered wiring board was produced by a co-firing or green sheet process in compliance with a normal means, wherein alumina is used as an insulating material and W-based paste is used as a conductor. A Cu based thin film, the thickness of which is 1 to 5 m or so, was formed on one major face of the in-layer type multi-layered wiring type multi-layered wiring board by a deposition or sputtering system. The top surface layer pattern including a mounting pad, mounting pad and weld ring was formed by photo etching the Cu based thin film. Subsequently, under the same conditions as those in the first embodiment, a hardening type conductive paste layer 410 was provided on the mounting pads 408a, 408b of the multi-layered wiring board 408, the semiconductor elements 409 and passive elements 411 were caused to correspond to the conductive paste layer 410 and were caused to be positioned and disposed thereat. Subsequently, by hardening the conductive paste layer 410, the electronic elements 409, 411 which had been mounted were electrically and mechanically connected and mounted, and an appointed wire bonding 414 is performed. Next, the opening edge 412a of a metal cap 412 is positioned at the weld ring 413 formed on the sealing pattern 408h of the multi-layered wiring board 408 with silver copper eutectic alloy, for example, whereby hermetic welding and sealing were carried out by laser beam irradiation to produce a multi-chip module.

The multi-chip modules produced as shown above were electrically tested and evaluated for reliability as usually recognized. In either case, the results were satisfactory. Furthermore, since no solder containing Pb was used, the working efficiency and working environment were good. Furthermore, even though disposed electronic elements are exposed to precipitation (eg. acid rain), there is completely no worry that Pb is dissolved and is immersed into soil. Therefore, even though underground water is drunk, there is no worry about problems to the nervous system, adverse affecting of fecundity, anemia, hypertension, generation of carcinogen, etc. Still furthermore, since it is possible to eliminate a cleaning process with an organic solvent, no problem is constituted due to flux residues in a case where a cleaning is performed after solder is used, whereby the invention greatly contributes to heightening the reliability of multi-chip modules, and suppresses generation of the environmental problems of the earth resulting in the destruction of the ozone layer. In addition, since a mounting pad of a multi-layered wiring board is formed by a thin film deposition system, it is possible to concentrate the wiring pitch and possible to deal with a number of pins of a semiconductor. Therefore, a high density mounting is able to achieve the compactness of electronic devices.

Furthermore, the invention is not limited to only the above embodiments. It is needless to say that various variations and modifications are possible without deviating from the spirits of the invention and the scope of claims attached herewith. For example, a multi-layered wiring board may be made of nitrided aluminum based material, glass ceramic based material, etc. in addition to alumina-based material, and such a construction that input/output pins are caused to protrude from one major side instead of input/output leads may be employed.

Here, a thick film multilayered wiring board 408 is such that an insulating layer made of ceramic material such as, for example, alumina and a wiring circuit 408b made of a conductor such as, for example, tungsten are laminated in layers. The wiring circuits are able to be connected beyond different layers. The thick film multi-layered wiring board 408 is provided with input/output pads 408c, 408c', input/output leads 408e, and input/output pins (not shown), which are means for making connections with peripheral devices. The input/output leads 408e and input/output pins are bonded together by, for example, silver copper eutectic alloy 408d, 408d'.

What is claimed is:

1. A multi-chip module comprising:
   a substrate comprising an inorganic material having a first wiring circuit, a first area formed on a first surface and a second area formed on the first surface which encloses the first area, the substrate having a mounting pad formed on the first area, and the substrate having a sealing pattern formed on the second area;
   an electronic element having a first surface facing the first area of the substrate, the electronic element having an electrode formed on the first surface;
   substantially lead-free mounting means for mounting the electronic element onto the first area of the substrate;
   a substantially lead-free metal cap having an opening end;
   a substantially lead-free sealing means for sealing the sealing pattern of the substrate and the opening end of the metal cap,
   wherein the mounting means consists of a substantially lead-free bump formed at the electrode of the electronic element and a substantially lead-free conductive resin which connects the mounting pad and the bump electrically and mechanically.

2. A multi-chip module as set forth in claim 1, wherein the bump is made of at least one element selected from a group of consisting of Au, Ag, Cu, Pd, Ni, Cr and Ti.

3. A multi-chip module comprising:
   a substrate comprising an inorganic material having a first wiring circuit, a first area formed on a first surface and a second area formed on the first surface which encloses the first area, the substrate having a mounting pad formed on the first area, and the substrate having a sealing pattern formed on the second area;
   a first electronic element having a first surface, the electronic element having a second surface facing the first area of the substrate, the electronic element having an electrode formed on the first surface;
   substantially lead-free mounting means for mounting the first electronic element onto the first area of the substrate;

a substantially lead-free metal cap having an opening end; and substantially lead-free sealing means for sealing the sealing pattern of the substrate and the opening end of the metal cap.

4. A multi-chip module comprising;

a substrate comprising an inorganic material having a first wiring circuit, a first area formed on a first surface and a second area formed on the first surface which encloses the first area, the substrate having a mounting pad formed on the first area, and the substrate having a sealing pattern formed on the second area;

an electronic element having a first surface facing the first area of the substrate, the electronic element having an electrode formed on the first surface;

a substantially lead-free conductive resin for mounting the electronic element onto the first area of the substrate;

a substantially lead-free metal cap having an opening end;

substantially lead-free weld ring for sealing the sealing pattern of the substrate and the opening end of the metal cap, wherein a content of lead in the conductive resin and the weld ring is less than about 1 wt %.

5. A multi-chip module as set forth in claim 4, wherein the content of lead is less than about 0.5 wt %.

6. A multi-chip module as set forth in claim 3, wherein the substantially lead-free mounting means comprises a substantially lead free conductive resin, and the substantially lead free sealing means comprises a weld ring, a content of lead in the conductive resin and the weld ring being less than about 1 wt %.

7. A multi-chip module as set forth in claim 6, wherein the content of lead is less than about 0.5 wt %.

8. A multi-chip module comprising:

a substrate comprising an inorganic material having a first wiring circuit, a first area formed on a first surface and a second area formed on the first surface which encloses the first area, the substrate having a first mounting pad formed on the first area and a second mounting pad formed on the first area, the substrate having a bonding pad formed on the first area, and the substrate having a sealing pattern formed on the second area;

an active element having a first surface and a second surface facing the first area of the substrate, the active element having an electrode formed on the first surface;

a passive element having an electrode, the passive element having a substantially lead-free metal layer deposited on the electrode;

substantially lead-free mounting means for mounting the active element and the passive element onto the first area of the substrate;

a substantially lead-free metal cap having an opening end; and substantially lead-free sealing means for sealing the sealing pattern of the substrate and the opening end of the metal cap, wherein the substantially lead-free mounting means comprises a substantially lead free conductive resin, and a content of lead in the metal layer and the conductive resin being less than about 1.0 wt %.

9. A multi-chip module as set forth in claim 8, wherein the content of lead is less than about 0.5 wt %.

10. A multi-chip module comprising:

a substrate comprising a substantially lead-free inorganic material having a first wiring circuit, a first area formed on a first surface and a second area formed on the first surface which encloses the first area:

electronic elements;

substantially lead-free mounting means for mounting the electronic elements onto the first area of the substrate;

a substantially lead-free metal cap having an opening end; and substantially lead-free sealing means for sealing the second area of the substrate and the opening end of the metal cap, wherein the substantially lead-free mounting means comprises a substantially lead-free conductive resin, and the substantially lead free sealing means comprises a substantially lead-free weld ring, a content of lead in the conductive resin and the weld ring being less than about 1 wt %.

11. A multi-chip module as set forth in claim 10 wherein the content of lead in the conductive resin and the weld ring is less than about 0.5 wt %.

12. A multi-chip module comprising:

a substrate comprising an inorganic material having a first wiring circuit, a first area formed on a first surface and a second area formed on the first surface which encloses the first area, the substrate having a mounting pad formed on the first area, and the substrate having a sealing pattern formed on the second area;

an electronic element having a first surface facing the first area of the substrate, the electronic element having an electrode formed on the first surface;

mounting means for mounting the electronic element onto the first area of the substrate, the mounting means comprising a substantially lead-free bump formed at the electrode of the electronic element and a substantially lead-free conductive resin which connects the mounting pad and the bump, electrically and mechanically;

a substantially lead-free metal cap having an opening end; and sealing means for sealing the sealing pattern of the substrate and the opening end of the metal cap, the sealing means comprising a weld ring brazed onto the sealing pattern with a substantially lead-free solder, and a deposited zone which connects the weld ring and the metal cap, wherein a content of lead in the substantially lead-free conductive resin less than about 1.0 wt %.

13. A multi-chip module as set forth in claim 12 wherein the content of lead in the substantially lead-free conductive resin is less than about 0.5 wt %.

14. A multi-chip module comprising:

a substrate comprising an inorganic material having a first wiring circuit, a first area formed on a first surface and a second area formed on the first surface which encloses the first area, the substrate having a mounting pad formed on the first area, and the substrate having a sealing pattern formed on the second area;

an electronic element having a first surface facing the first area of the substrate, the electronic element having an electrode formed on the first surface;

mounting means for mounting the electronic element onto the first area of the substrate, the mounting means comprising a substantially lead-free metal film deposited on the electrode of the electronic element and a substantially lead-free conductive resin which connects the mounting pad and the electrode having the metal film, electrically and mechanically;

a substantially lead-free metal cap having an opening end; and sealing means for sealing the sealing pattern of the substrate and the opening end of the metal cap, the sealing means comprising a weld ring brazed onto the sealing pattern with a substantially lead-free solder, and a deposited zone which connects the weld ring and the metal cap, wherein a content of lead in the substantially lead-free conductive resin is less than about 1.0 wt %.

15. A multi-chip module as set forth in claim 14 wherein the content of lead in the substantially lead-free conductive resin is less than about 0.5 wt %.

16. A multi-chip module comprising:

a substrate comprising an inorganic material having a first wiring circuit, a first area formed on a first surface and a second area formed on the first surface which encloses the first area, the substrate having a mounting pad and a bonding pad formed on the first area, and the substrate having a sealing pattern formed on the second area;

a first electronic element having a first surface, the electronic element having a second surface facing the first area of the substrate, the electronic element having an electrode formed on the first surface;

mounting means for mounting the first electronic element onto the first area of the substrate, the mounting means comprising substantially lead-free conductive resin mechanically connecting the mounting pad and the second surface of the first electronic element and a substantially lead-free bonding wire electrically connecting the bonding pad of the substrate and the electrode of the first electronic component;

a substantially lead-free metal cap having an opening end; and sealing means for sealing the sealing pattern of the substrate and the opening end of the metal cap, the sealing means comprising a weld ring brazed onto the sealing pattern with a substantially lead-free solder, and a deposited zone which connects the weld ring and the metal cap, wherein a content of lead in the substantially lead-free conductive resin is less than about 1.0 wt %.

17. A multi-chip module as set forth in claim 16 wherein the content of lead in the substantially lead-free conductive resin is less than about 0.5 wt %.

18. A multi-chip module comprising:

a substrate comprising an inorganic material having a first wiring circuit, a first area formed on a first surface and a second area formed on the first surface which encloses the first area, the substrate having a mounting pad formed on the first area, and the substrate having a sealing pattern formed on the second area;

an electronic element having a first surface facing the first area of the substrate, the electronic element having an electrode formed on the first surface;

a substantially lead-free bump formed at the electrode of the electronic element and a substantially lead-free conductive resin which connects the mounting pad and the bump electrically and mechanically;

a substantially lead-free metal cap having an opening end; and a substantially lead-free weld ring for sealing the sealing pattern of the substrate and the opening end of the metal cap.

19. A multi-chip module as set forth in claim 18, wherein the bump is made of at least one element selected from the group consisting of Au, Ag, Cu, Pd, Ni, Cr and Ti.

20. A multi-chip module as set forth in claim 18, wherein a lead content in each of the substantially lead-free bump, the substantially lead-free conductive resin, the substantially lead-free metal cap, and the substantially lead-free weld ring is less than about 1 wt %.

* * * * *

UNITED STATES PATENT AND TRADEMARK OFFICE
CERTIFICATE OF CORRECTION

PATENT NO.: 5,949,654
DATED: September 7, 1999
INVENTOR(S): Fukuoka

It is certified that an error appears in the above-identified patent and that said Letters Patent is hereby corrected as shown below:

Claim 4, column 25, line 6, delete "comprising;" and insert --comprising:--.

Claim 10, column 26, line 2, delete "area:" and insert --area;--.

Signed and Sealed this

Sixth Day of June, 2000

*Attest:*

Q. TODD DICKINSON

*Attesting Officer*     *Director of Patents and Trademarks*